(12) United States Patent
Kring et al.

(10) Patent No.: US 10,705,666 B2
(45) Date of Patent: Jul. 7, 2020

(54) VEHICLE INTERIOR COMPONENT WITH USER INTERFACE

(71) Applicant: SHANGHAI YANFENG JINQIAO AUTOMOTIVE TRIM SYSTEMS CO. LTD., Shanghai (CN)

(72) Inventors: Christopher Kring, Zeeland, MI (US); Mario J. Enriques Ortiz, Holland, MI (US); Tyler J. Newkirk, Grand Rapids, MI (US); Ankit Singh, Seattle, WA (US)

(73) Assignee: Shanghai Yangfeng Jinqiao Automotive Trim Systems Co. Ltd., Shanghai (CN)

( * ) Notice: Subject to any disclaimer, the term of this patent is extended or adjusted under 35 U.S.C. 154(b) by 84 days.

(21) Appl. No.: 14/852,409

(22) Filed: Sep. 11, 2015

(65) Prior Publication Data

US 2016/0004362 A1 Jan. 7, 2016

Related U.S. Application Data

(63) Continuation-in-part of application No. PCT/US2014/050718, filed on Aug. 12, 2014.

(Continued)

(51) Int. Cl.
*G06F 3/045* (2006.01)
*G06F 1/16* (2006.01)
(Continued)

(52) U.S. Cl.
CPC .............. *G06F 3/045* (2013.01); *B60K 35/00* (2013.01); *B60K 37/06* (2013.01); *B60N 2/0228* (2013.01);
(Continued)

(58) Field of Classification Search
CPC ...... H05K 1/0298; B60K 37/06; B60K 35/00; B60K 2370/143; B60K 2370/1464;
(Continued)

(56) References Cited

U.S. PATENT DOCUMENTS

| 6,571,511 B1 | 6/2003 | Plottnik | |
| 2002/0101738 A1* | 8/2002 | Misaras | B60K 37/06 362/487 |

(Continued)

FOREIGN PATENT DOCUMENTS

| CN | 102089626 | 6/2011 |
| CN | 103154862 | 6/2013 |

(Continued)

OTHER PUBLICATIONS

Extended European Search Report for European Application No. 14836038.1 dated Oct. 13, 2016.

(Continued)

*Primary Examiner* — William Boddie
*Assistant Examiner* — Saifeldin E Elnafia
(74) *Attorney, Agent, or Firm* — Amin, Turocy & Watson, LLP

(57) ABSTRACT

A user interface system for a vehicle interior includes a contact surface, a sensor grid and a controller. The sensor grid is configured for variable electrical resistance in response to applied pressure and the controller is configured to detect the electrical resistance of the sensor grid by monitoring a voltage. The controller detects the location of an input from a vehicle occupant, the intensity of the input, and the duration of the input.

21 Claims, 15 Drawing Sheets

Related U.S. Application Data

(60) Provisional application No. 61/865,450, filed on Aug. 13, 2013, provisional application No. 61/865,001, filed on Aug. 12, 2013, provisional application No. 62/048,848, filed on Sep. 11, 2014.

(51) Int. Cl.

| | | |
|---|---|---|
| *H05K 1/02* | (2006.01) | |
| *G06F 3/0488* | (2013.01) | |
| *G06F 3/041* | (2006.01) | |
| *B60K 37/06* | (2006.01) | |
| *B60N 2/02* | (2006.01) | |
| *B60K 35/00* | (2006.01) | |

(52) U.S. Cl.
CPC .............. *G06F 1/16* (2013.01); *G06F 3/0414* (2013.01); *G06F 3/04883* (2013.01); *H05K 1/0298* (2013.01); *B60K 2370/143* (2019.05); *B60K 2370/1464* (2019.05); *B60K 2370/1468* (2019.05); *B60K 2370/55* (2019.05); *B60K 2370/77* (2019.05); *B60K 2370/774* (2019.05); *G06F 3/0412* (2013.01); *G06F 2203/04808* (2013.01)

(58) Field of Classification Search
CPC .......... B60K 2370/774; B60K 2370/55; B60K 2370/1468; B60K 2370/77; G06F 1/16; G06F 3/0412; G06F 3/0414; G06F 3/04883; G06F 2203/04808; G06F 3/0416; G06F 3/046; G06F 3/047; G06F 3/044; G06F 3/045; B60N 2/0228
See application file for complete search history.

(56) References Cited

U.S. PATENT DOCUMENTS

| | | | |
|---|---|---|---|
| 2005/0165526 A1 | 7/2005 | Stam et al. | |
| 2010/0045624 A1* | 2/2010 | Hisatsugu | B60H 1/00985 345/173 |
| 2010/0095245 A1 | 4/2010 | Fino et al. | |
| 2010/0226539 A1 | 9/2010 | Ishii | |
| 2011/0001722 A1 | 1/2011 | Newman et al. | |
| 2011/0096025 A1 | 4/2011 | Slobodin et al. | |
| 2011/0182081 A1* | 7/2011 | Oeuvrard | B60K 35/00 362/488 |
| 2011/0290038 A1* | 12/2011 | Hoshino | G01L 1/20 73/862.627 |
| 2012/0313857 A1* | 12/2012 | Senanayake | G06F 3/016 345/168 |
| 2013/0333922 A1 | 12/2013 | Kai et al. | |
| 2014/0054919 A1* | 2/2014 | Oeuvrard | B60K 37/06 296/70 |
| 2014/0365928 A1 | 12/2014 | Boelter et al. | |
| 2015/0000425 A1 | 1/2015 | Miura et al. | |
| 2015/0185843 A1* | 7/2015 | Olien | B60W 50/16 345/174 |
| 2015/0185946 A1* | 7/2015 | Fourie | G06F 3/0416 345/174 |
| 2016/0109982 A1 | 4/2016 | Lee et al. | |
| 2016/0373110 A1 | 12/2016 | Koehne et al. | |

FOREIGN PATENT DOCUMENTS

| | | |
|---|---|---|
| CN | 104067098 A | 9/2014 |
| EP | 2305508 | 2/2012 |
| EP | 2793111 | 10/2014 |
| EP | 2816334 B1 | 4/2017 |
| JP | 2002-48658 | 2/2002 |
| JP | 2002048658 | 2/2002 |
| JP | 2013164365 A | 8/2013 |
| JP | 2013088559 A1 | 4/2015 |
| WO | 2012147948 A1 | 1/2012 |
| WO | 2013122038 A1 | 8/2013 |
| WO | 2015001496 A1 | 1/2015 |
| WO | 2015023668 A1 | 2/2015 |

OTHER PUBLICATIONS

Written Opinion of the International Searching Authority for Application No. PCT/US2014/050718 dated Nov. 25, 2014 (4 pages).

Search Report of the International Searching Authority for Application No. PCT/US2014/050718 dated Nov. 25, 2014 (10 pages).

Notification of Transmittal of International Search Report and Written Opinion of the International Searching Authority (PCT/ISA/220) with International Search Report (PCT/ISA/210) and Written Opinion of the International Searching Authority (PCT/ISA/237) for International Application No. PCT/US17/41523 dated Nov. 7, 2017 (21 pages)

Communication in Cases for Which No Other Form is Applicable (PCT/ISA/224) with Written Opinion of the International Searching Authority (Corrected PCT/ISA/237) and International Search Report (Corrected PCT/ISA/210) for International Application No. PCT/US17/41523 dated Dec. 8, 2017 (16 pages).

Chinese Office Action for Chinese Patent App. Serial No. 201480056000.1; 15 Pages.

Office Action for Chinese Application Serial No. 201480056000.1, 13 pages.

Office Action for European Application Serial No. 14836038.1 dated May 31, 2018, 9 pages.

\* cited by examiner

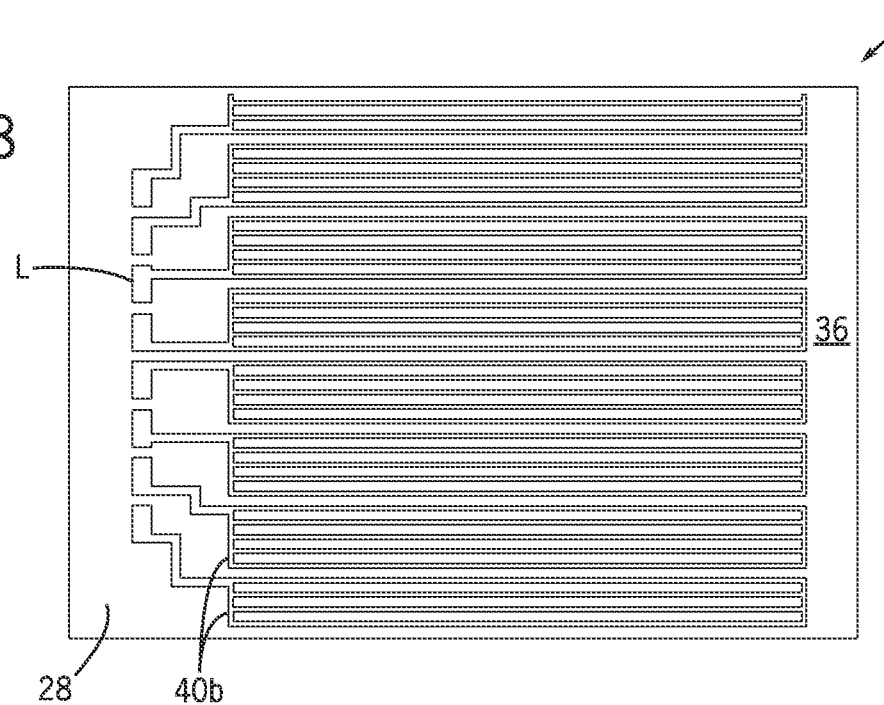
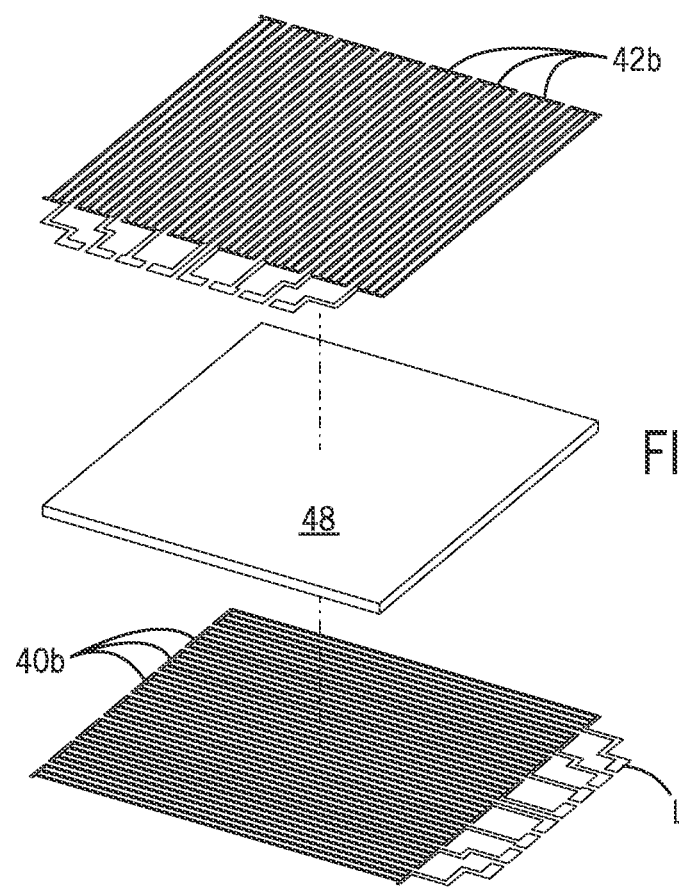

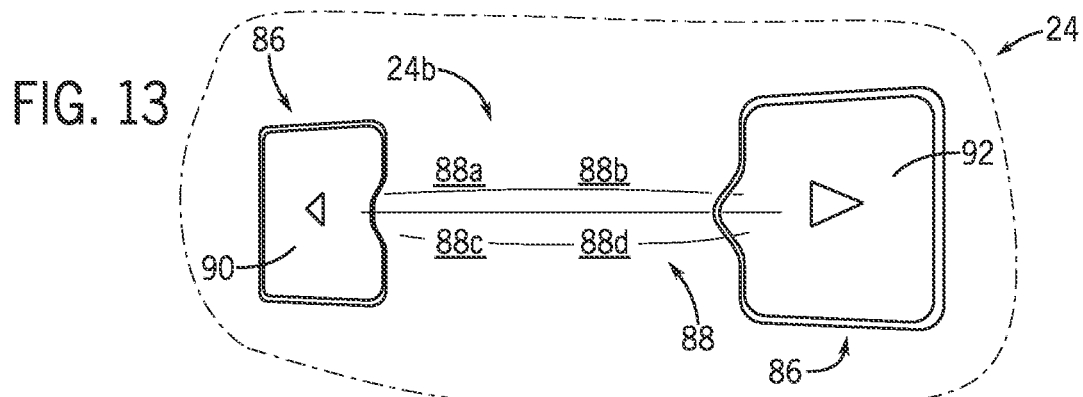
FIG. 13
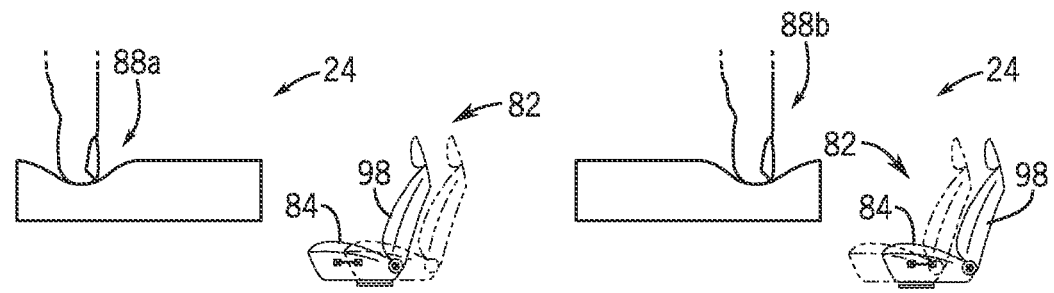
FIG. 14A          FIG. 14B
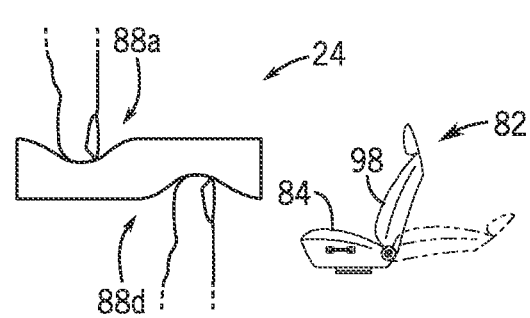   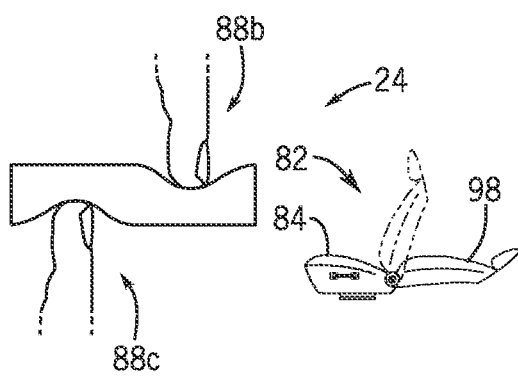
FIG. 14C          FIG. 14D
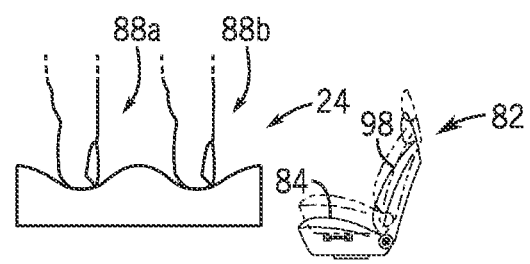   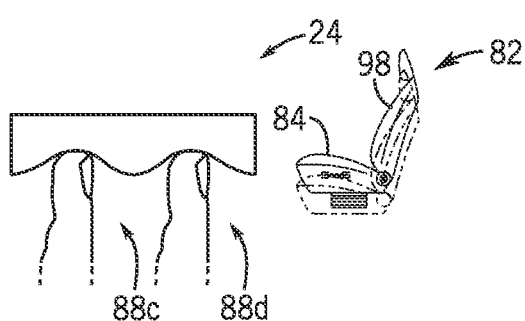
FIG. 14E          FIG. 14F

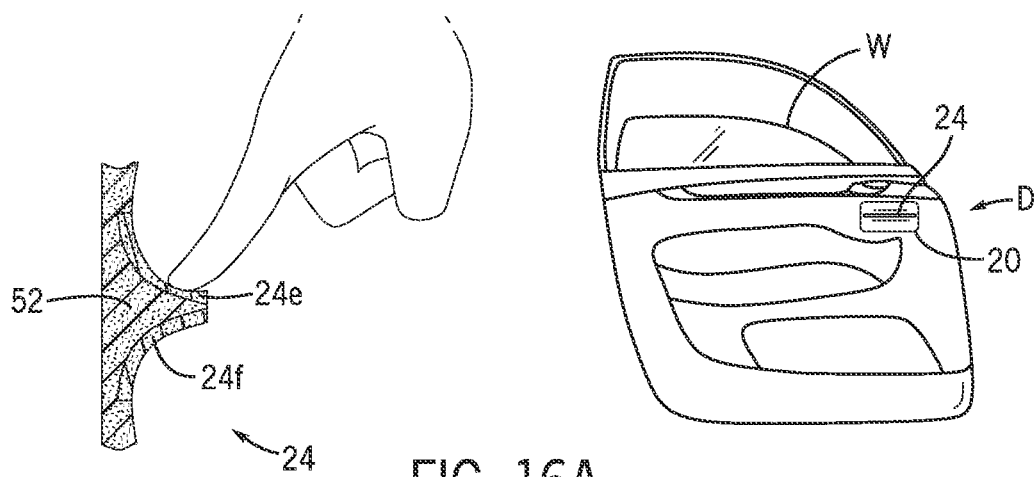
FIG. 16A
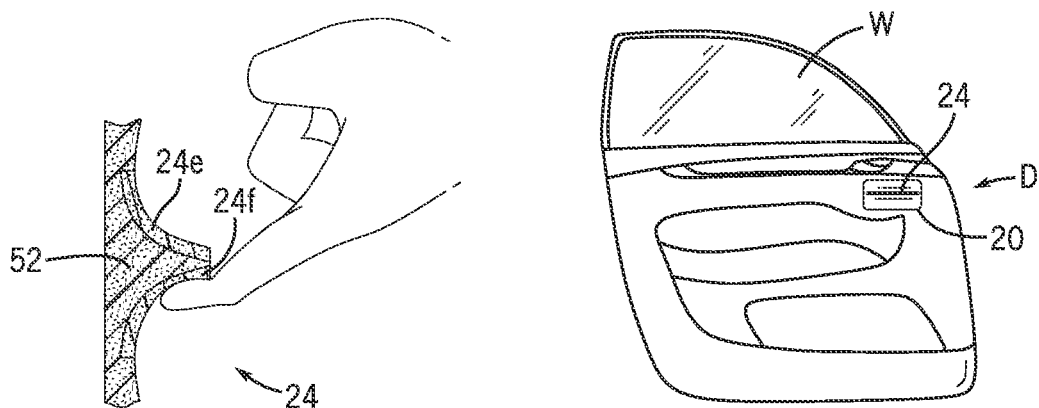
FIG. 16B
FIG. 16C
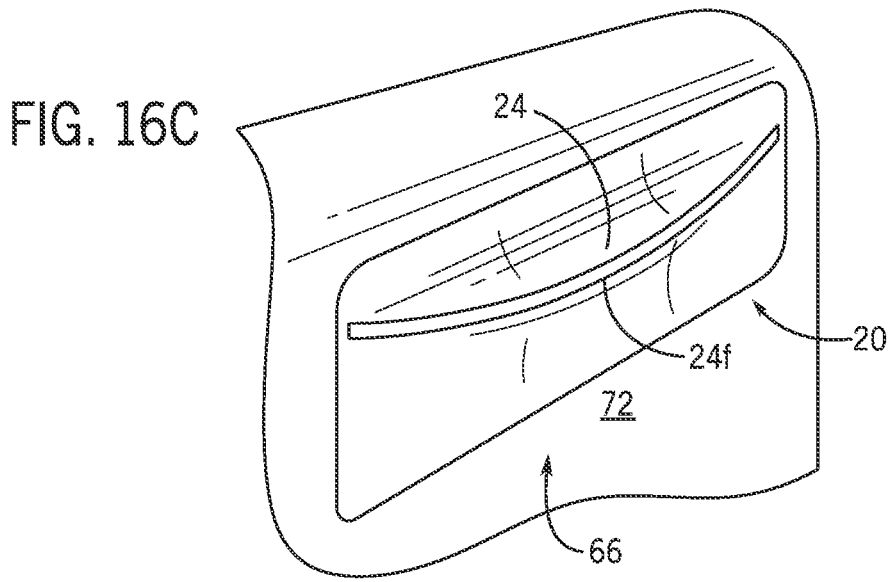

VEHICLE INTERIOR COMPONENT WITH USER INTERFACE

CROSS-REFERENCE TO RELATED APPLICATIONS

The present application is a continuation-in-part and claims priority to and incorporates by reference the following applications: (a) PCT Application No. PCT/US2014/50718 filed Aug. 12, 2014 and (b) U.S. Provisional Application No. 61/865,450 filed Aug. 13, 2013 and (c) U.S. Provisional Application No. 61/865,001, filed Aug. 12, 2013 and (d) U.S. Provisional Application No. 62/048,848, filed Sep. 11, 2014.

FIELD

The present invention relates to vehicle interiors, and more particularly to user interfaces within a vehicle.

BACKGROUND

Conventional automotive interiors may include numerous switches, buttons, dials, and other physical control elements for receiving inputs from an occupant. Control elements are coupled to corresponding features and systems including entertainment systems, information systems, climate controls, door locks, window regulators, seat position adjusters, cruise control, mirror position adjusters, headlights, steering wheel adjusters, and etc.

SUMMARY

It would be advantageous to provide a user interface with control elements in a vehicle interior and/or with vehicle interior components to enable the driver or occupant to control various functions, features, equipment, etc. of the vehicle.

The present invention relates to a user interface system for a vehicle interior comprising a contact surface, a sensor grid, and a controller, wherein the sensor grid is configured for variable electrical resistance in response to applied pressure and the controller is configured to detect the electrical resistance of the sensor grid by monitoring a voltage.

The present invention relates to a user interface system configured to receive at least one input from a vehicle occupant for a vehicle comprising a contact surface, a sensor, and a controller, wherein the controller is configured to detect at least one of the location of the input, the intensity of the input, or the duration of the input.

The present invention relates to a control system for controlling functions, features, or equipment in a vehicle. The control system may include a pressure sensing interface having a sensor grid embedded within a plurality of deformable material layers. The control system may also include a controller operable to identify a user input within the sensor grid by monitoring electrical resistance across the sensor grid in response to the pressure sensing interface being depressed. Specific regions of the pressure sensing interface may be associated with control of specific functions of vehicle equipment and/or systems.

Features and aspects of the present inventions are disclosed according to exemplary embodiments in the detailed description and accompanying FIGURES.

FIGURES

FIG. 8 is a schematic plan view of the configuration of the user interface system according to an exemplary embodiment.

FIG. 9 is a schematic exploded perspective view of the configuration of the user interface system according to an exemplary embodiment.

FIG. 13 is a schematic diagram of a user interface system for a vehicle system according to an exemplary embodiment.

FIGS. 14A through 14F are schematic diagrams of operation of the user interface system for a vehicle system shown as a vehicle seat according to an exemplary embodiment.

FIGS. 16A and 16B are schematic cross-section views and schematic diagrams of operation of the user interface system for a vehicle system shown as a vehicle window according to an exemplary embodiment.

FIG. 16C is a perspective view of an automotive window control system including a user interface according to an exemplary embodiment.

DETAILED DESCRIPTION

According to an exemplary embodiment a vehicle with a vehicle system (e.g. switches, controls, lighting, windows, sunroof, etc.) and a vehicle interior providing components (e.g. trim components, panels, door panels, consoles, overhead systems, etc.) is shown schematically in FIGS. 1A through 1D. As indicated schematically in FIGS. 1B, 1C and 1D, the vehicle interior and/or vehicle interior components (e.g. trim components, panels, door panels, consoles, overhead systems, etc.) may be provided with a user interface system comprising a user interface 24. As shown in FIGS. 2A-2B and 3A-3B, the user interface system may be integrated with any of a variety of vehicle interior components and configured to facilitate control/operation of vehicle systems, functions, features, etc. by a vehicle occupant (e.g. vehicle controls, cruise control, windows, sunroof, heating/cooling and ventilation (HVAC), defroster, seats, seat heaters, mirrors, door locks, etc.).

Figure 1A:
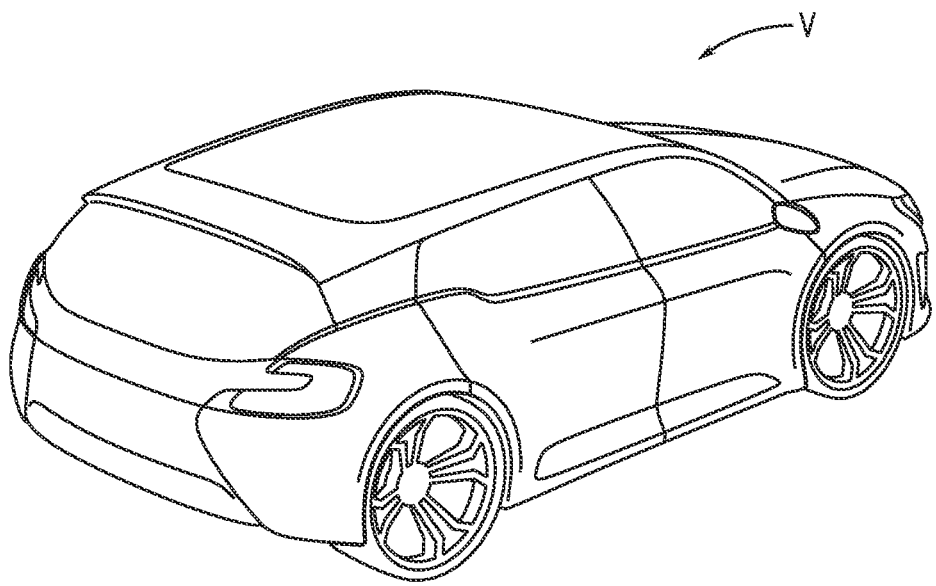
FIG. 1A is a schematic rear perspective view of a vehicle according to an exemplary embodiment.
Figure 1B:
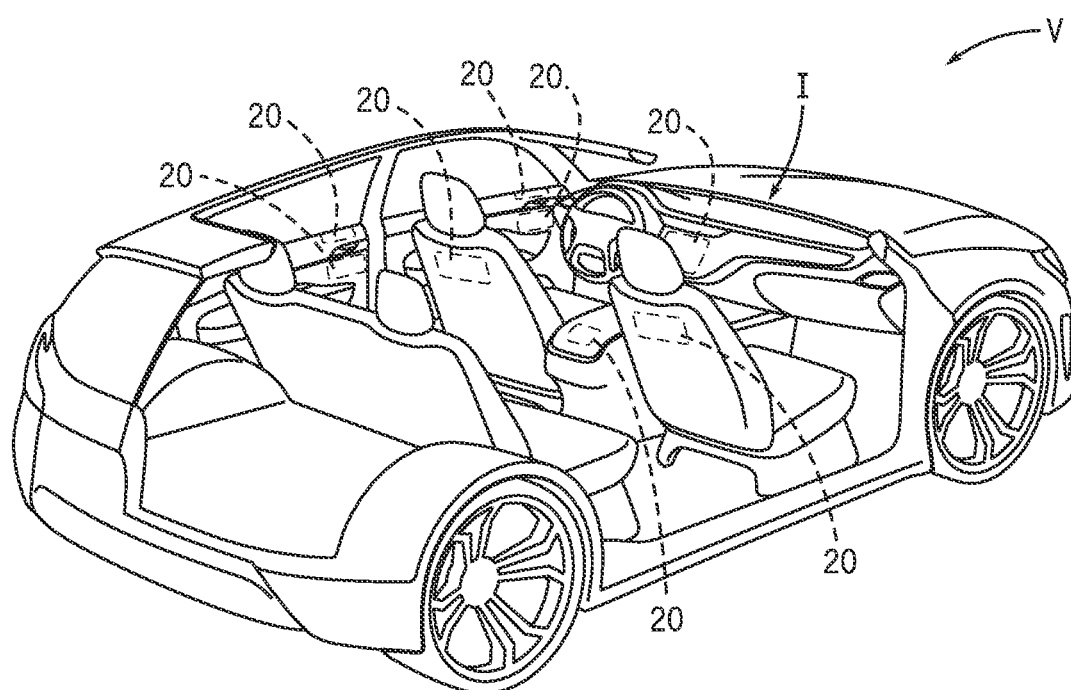
FIGS. 1B and 1C are schematic rear perspective cutaway views of the vehicle according to an exemplary embodiment.
Figure 1C:
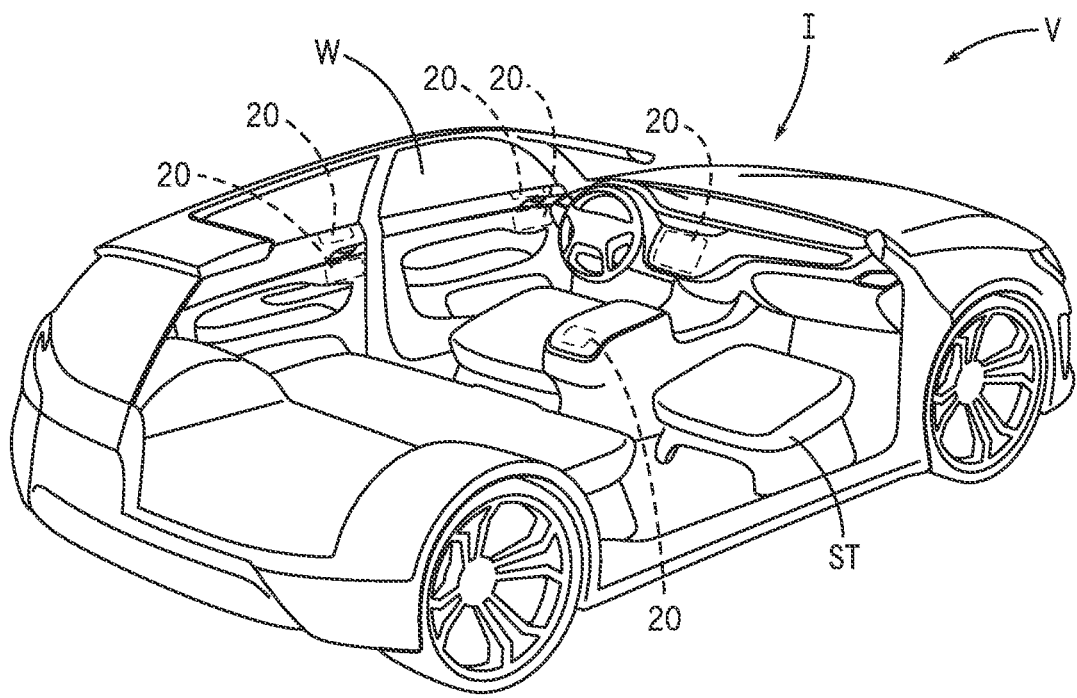
Figure 1D:
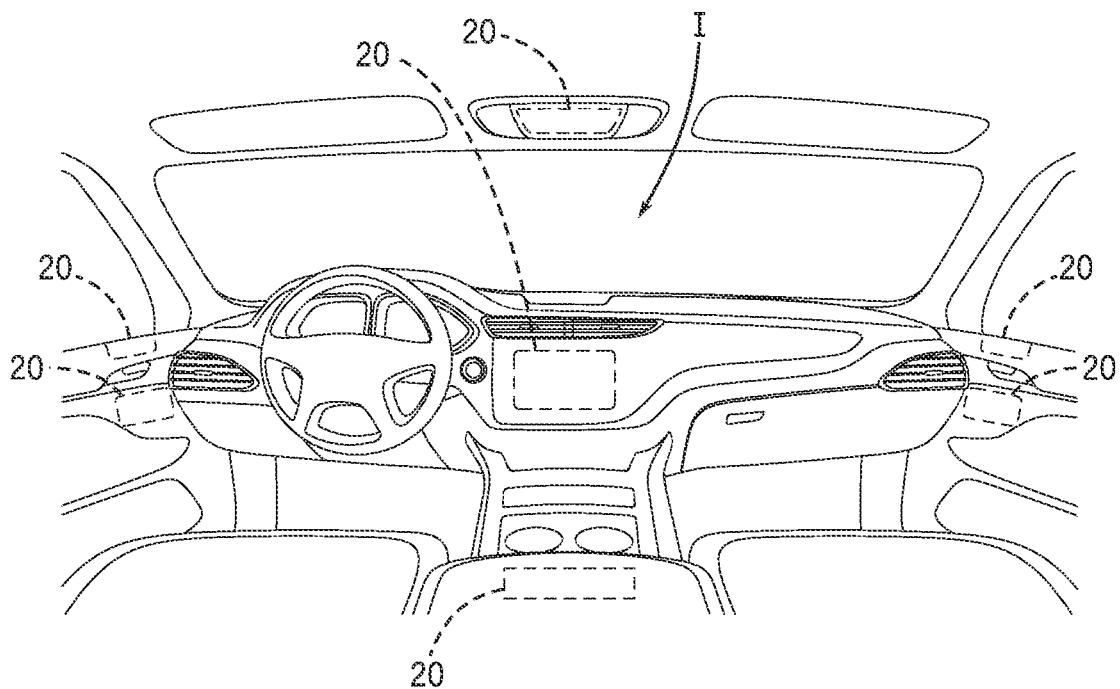
FIG. 1D is a schematic front view of a portion of an interior of the vehicle according to an exemplary embodiment.
Figure 2A:
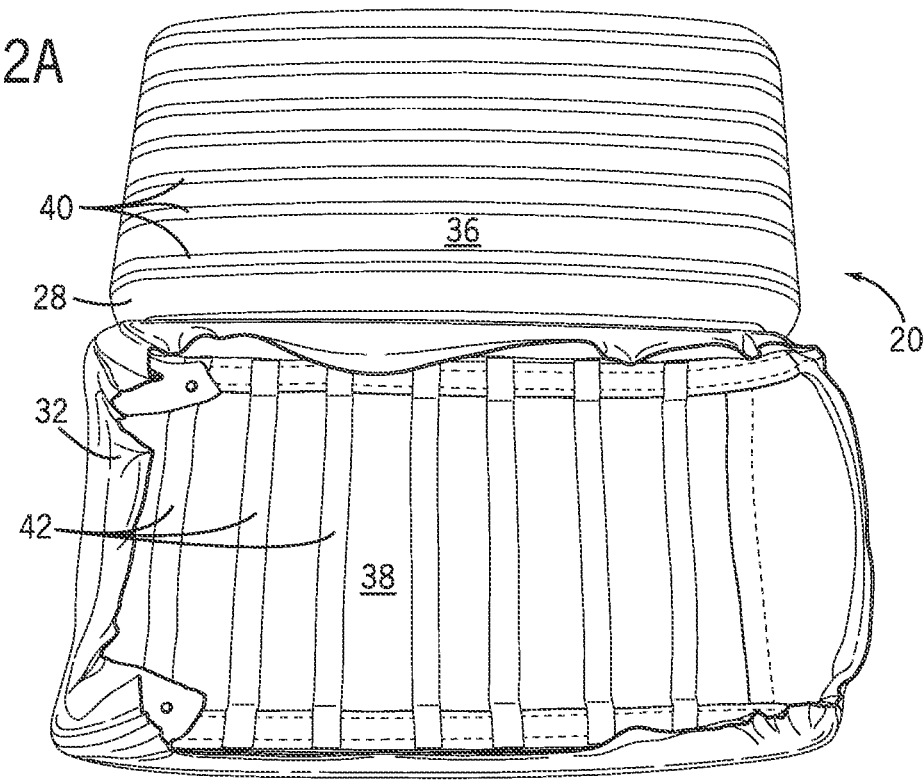
FIG. 2A is a schematic view of a vehicle interior component according to an exemplary embodiment.

FIG. 2A shows a vehicle interior component shown as trim panel 20 for mounting within a vehicle (shown as vehicle V in FIGS. 1A through 1D). As indicated, the vehicle interior component (e.g. trim panel, etc.) is configured to comprise the user interface system providing user interface 24. See e.g. FIGS. 1B-1D, 3A-4, 6A-7C, 15A-16C. According to an exemplary embodiment, the trim panel 20 is an armrest for placement adjacent one or more seats within the vehicle. According to an exemplary embodiment, the trim panel 20 may be provided in a variety of forms and constructions. As shown schematically, the vehicle interior trim component (e.g. trim panel 20) may be provided with a user interface system 20 comprising a user interface 24 for the vehicle occupant. See FIGS. 1B through 1D, 3A through 3B, 5, 6A through 6H, 13, 14A through 14F, 15A through 15C.

Figure 3A:
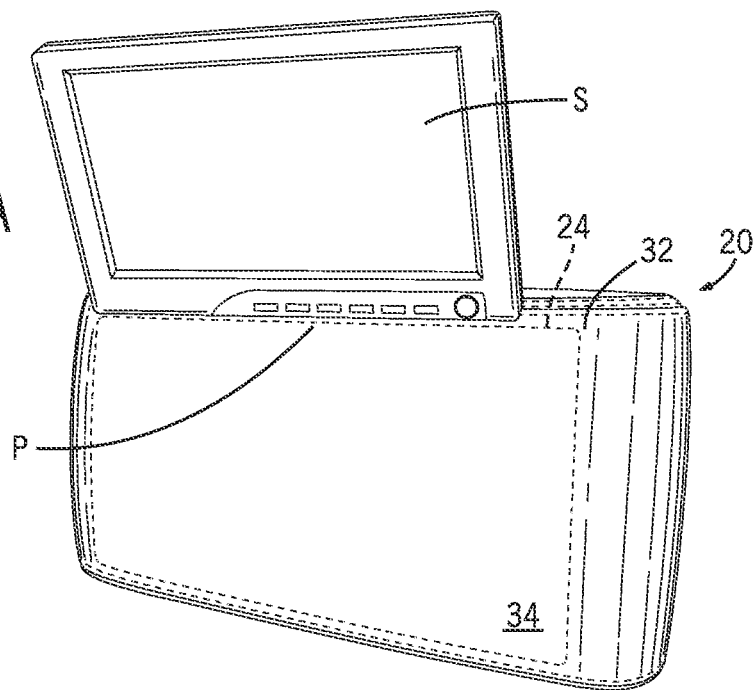
FIG. 3A is a schematic front perspective view of a vehicle interior component according to an exemplary embodiment.
Figure 3B:
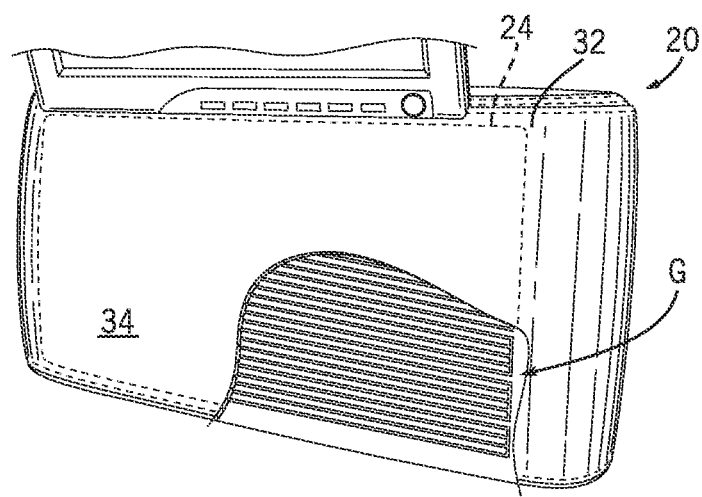
FIG. 3B is a schematic front perspective cutaway view of the component according to an exemplary embodiment.
Figure 4:
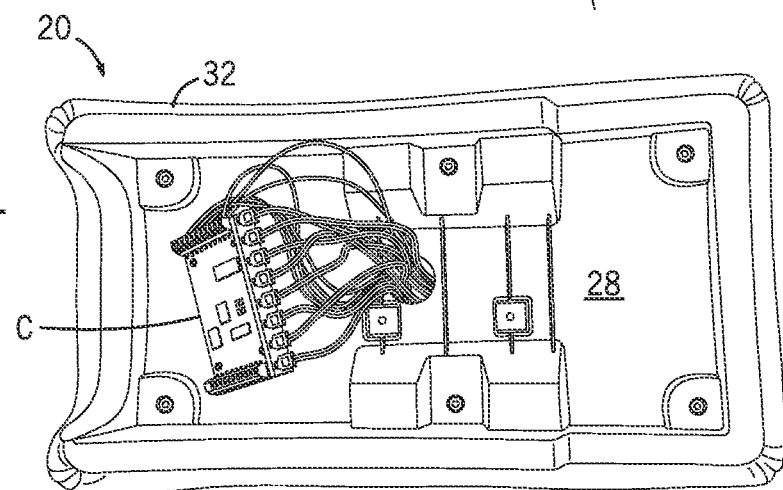
FIG. 4 is a schematic rear perspective view of the component according to an exemplary embodiment.

According to an exemplary embodiment, the trim panel 20 includes a base 28 and a cover layer or covering 32. The covering 32 may cover all or portions of the base 28 when assembled. The base 28 may define the shape of the trim panel 20 and provide all or a substantial majority of the rigidity of the trim panel 20, while the covering 32 has an exterior surface 34 that defines all or most of the exposed surface of the trim panel 20 (i.e., exposed to the vehicle cabin and occupants). The covering 32 may be form-fitting over the base 28 as shown in FIG. 3A. Both the base 28 and the covering 32 can be constructed from materials that are not electrically conductive. For example, the base 28 may be constructed of hard plastic and the covering 32 may be constructed of leather, vinyl, thin metal with electrically insulating laminated layer, plastic, wood or textile fabric. Typical display screens which are used as vehicle control panels; the pressure sensing interface 24 can provide an exterior contact surface or material which is non-translucent and flexible due to the covering 32.

As shown in FIG. 2A, the co-facing surfaces of the base 28 and the covering 32 (i.e., a cover-facing surface 36 of the base 28 and a base-facing surface 38 of the covering 32) are each provided with a plurality of conductive strips 40, 42. The conductive strips 42 on the covering 32 are flexible along with the covering 32 in response to light to moderate pressure from a human hand. The conductive strips 40, 42 can be constructed of metal foil adhesively bonded to the underlying substrate (i.e., base 28 or covering 32). According to an exemplary embodiment, the conductive strips 40, 42 can be provided as printed conductive strips, such as screen printed conductive ink strips. The conductive strips 40 provided on the base 28. are arranged side-by-side, all extending parallel to each other in a first direction (e.g., a longitudinal direction of the armrest 20). The conductive strips 42 provided on the covering 32 are arranged side-by-side, all extending parallel to each other in a second direction (e.g., a transverse direction of the armrest 20). The two sets of conductive strips 40, 42 can extend substantially perpendicular to each other to define a matrix or lattice when stacked together. The lattice defines a grid resolution that is equal to the number of conductive strips 40 on the base 28 times the number of conductive strips 42 on the covering 32. According to an exemplary embodiment, the two sets of conductive strips 40, 42 overlap and are arranged to contact with an intermediate layer 48. If the user interface system includes a display screen, the grid resolution for grid G of the user interface system 20 for the screen may correspond generally to the grid resolution of the display screen. See FIG. 7B. In some constructions, the grid resolution can be increased by increasing the number of conductive strips in the two sets of conductive strips 40, 42. According to an exemplary embodiment, interpolation can be implemented to identify portions of the trim panel 20 between the conductive strips 40, 42 to which pressure is being applied based on pressures detected using adjacent conductive strips 40, 42. A combination of increasing the number of conductive strips and interpolation can be implemented to increase or maximize grid resolution. According to an exemplary embodiment, the conductive strips 40, 42 can be provided adjacent the cover-facing surface 36 of the base 28 and the base-facing surface 38 of the covering 32, rather than directly thereon. For example, each set of conductive strips 40, 42 can be provided on a separate film layer.

Figure 5:
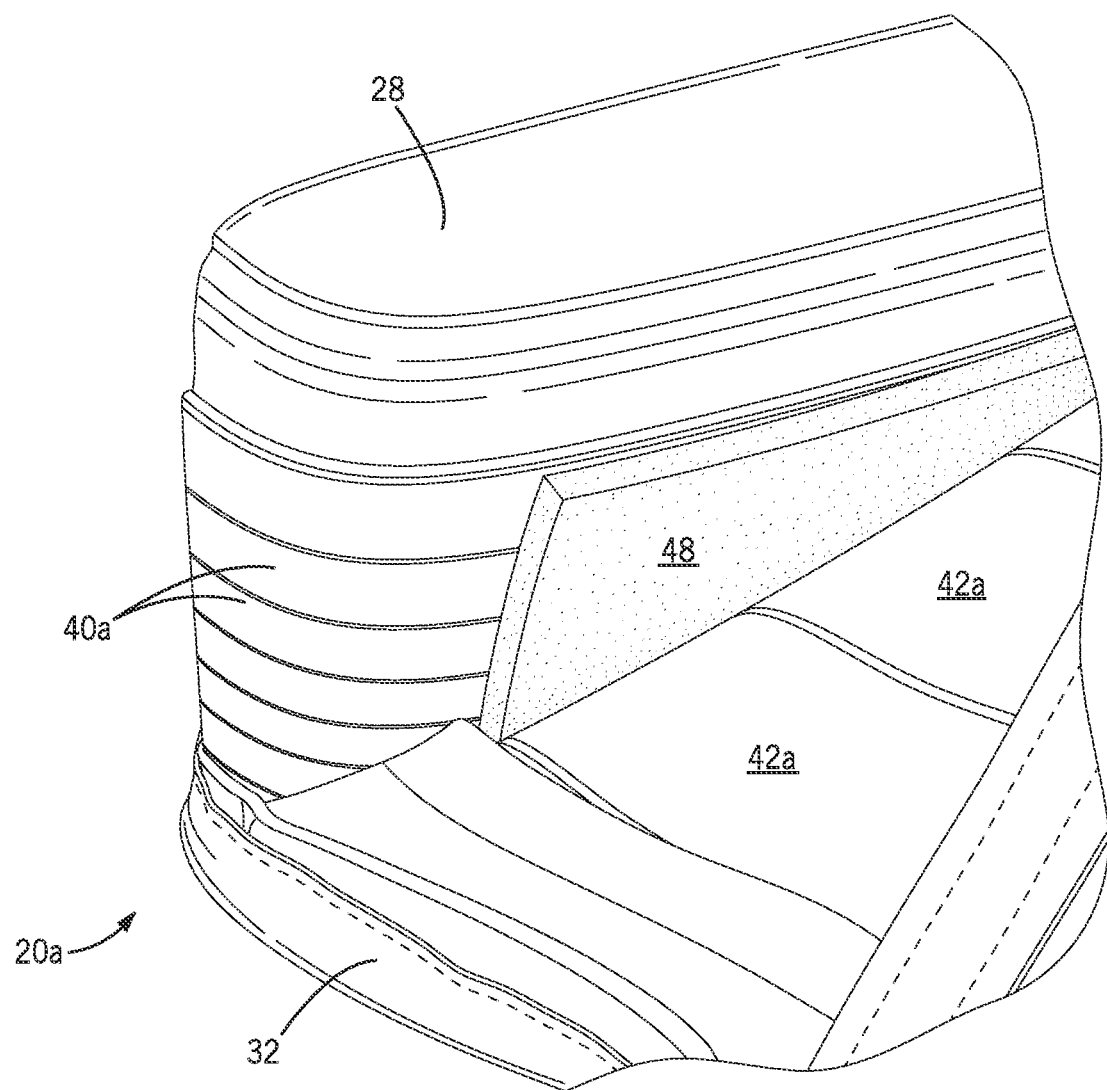
FIG. 5 is a schematic partial perspective view of a vehicle interior component according to an exemplary embodiment.

FIG. 5 illustrates a trim panel 20 similar to the trim panel 20 of FIGS. 2A through 4 with conductive strips 40, 42 according to an exemplary embodiment. The conductive strips 40, 42 as shown in FIG. 2A cover half or less of the area of the respective surfaces 36 and 38; according to an exemplary embodiment, the conductive strips 40, 42 of FIG. 5 cover substantially the entire surfaces 36, 38, with only minimal spacing between each adjacent strip. According to an exemplary embodiment, the width of the conductive strips and the spacing may be varied as desired or as necessary for particular application-specific outcomes. FIG. 8 shows a set of conductive strips 40b according to an exemplary embodiment. In FIG. 8, each individual (electrically isolated) conductive strip 40b is provided as a plurality of printed circuits of interconnected strips with spaces to provide the functionality of a larger strip width without excessive material usage. According to an exemplary embodiment, the construction is applied to the conductive strips 42b in the schematic exploded perspective view of FIG. 9.

Figure 2B:
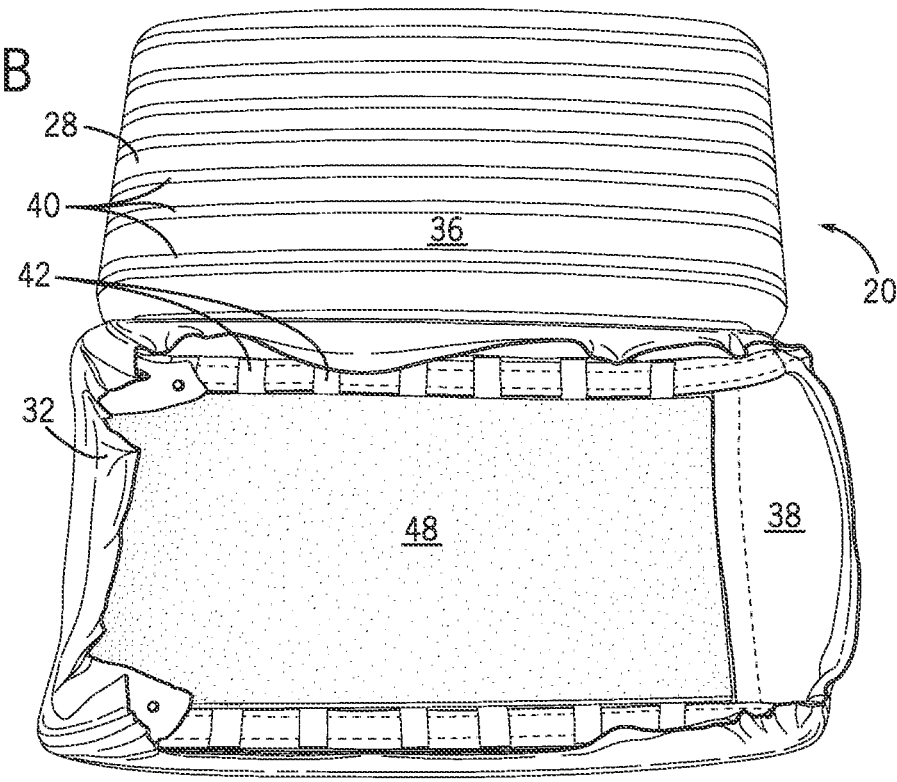
FIG. 2B is a schematic view of the component according to an exemplary embodiment.

According to an exemplary embodiment shown in FIG. 2B, an intermediate layer 48 is positioned between the base 28 and the covering 32 to separate the two sets of conductive strips 40, 42 when the covering 32 is installed over the base 28. According to an exemplary embodiment, the intermediate layer 48 is constructed of a resilient compressible material, such as polyurethane foam for example. The intermediate layer 48 provides a compressible gap whereby a positive displacement distance between the co-facing surfaces 36, 38 is nominally maintained at a maximum value and can be reduced to a minimum value approaching zero when the intermediate layer 48 is fully compressed. According to an exemplary embodiment, the intermediate layer 48 can have compression-responsive electrical resistance based on a variable electrical resistivity (or reciprocally, electrical conductivity). For example, the intermediate layer 48 can display a nominal amount of electrical resistance between the two sets of conductive strips 40, 42 when in the natural, uncompressed state and can display decreasing amounts of electrical resistance (i.e., as a product of increased conductivity) as compressed. The electrical resistance of the intermediate layer 48 varies on a localized basis, only where compressed. According to an exemplary embodiment, the compression-responsive electrical resistance of the intermediate layer 48 is imparted by conductive particles interspersed within a non-conductive compressible substrate. For example, carbon "dust" (i.e., carbon black particles) may be interspersed within polyurethane foam.

The assembly of the two sets of conductive strips 40, 42 and the intermediate layer 48 make up a sensor grid. The interface 24 is defined as the area of the covering 32 in which the sensor grid is positioned. One set of conductive strips 40, 42 is defined as the input end of the sensor grid and the other set of conductive strips 40, 42 is defined as the output end of the sensor grid. According to an exemplary embodiment shown in FIGS. 10A through 10C, an input voltage $V_{Ref}$ is applied to each of the conductive strips of the input end (e.g., conductive strips 42). Each conductive strip of the output end (e.g., conductive strips 40) is monitored or scanned to detect changes in the resistance $R_1$ of the intermediate layer 48 that are indicative of compression of the covering 32 and the intermediate layer 48 toward the base 28. The manner in which voltages are applied to the conductive strips 40, 42 and the manner in which the conductive strips 40, 42 are monitored or scanned. A sensed voltage $V_0$ is monitored at each conductive strip 40 at the output end. According to an exemplary embodiment shown schematically in FIG. 10C, a fixed resistance $R_2$ may be placed between the location of sensed voltage $V_2$ and ground or between $V_2$ and any reference voltage (e.g. 12V). As the pressure applied to the intermediate layer 48 is increased, the sensed voltage $V_2$ also increases as the resistance $R_2$ decreases.

Figure 10A:
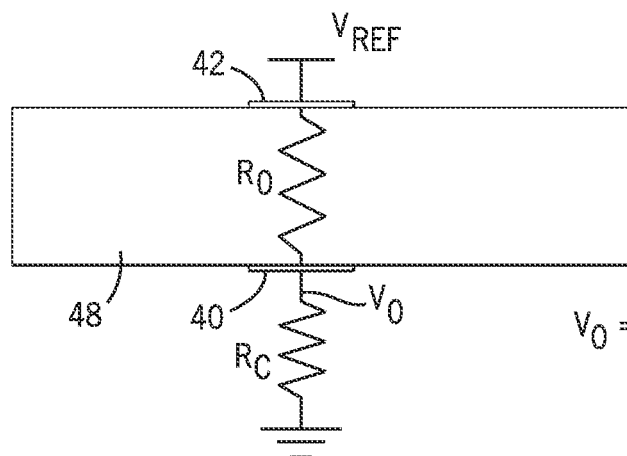
FIGS. 10A through 10C are schematic circuit diagrams of the user interface system according to an exemplary embodiment.
Figure 10B:
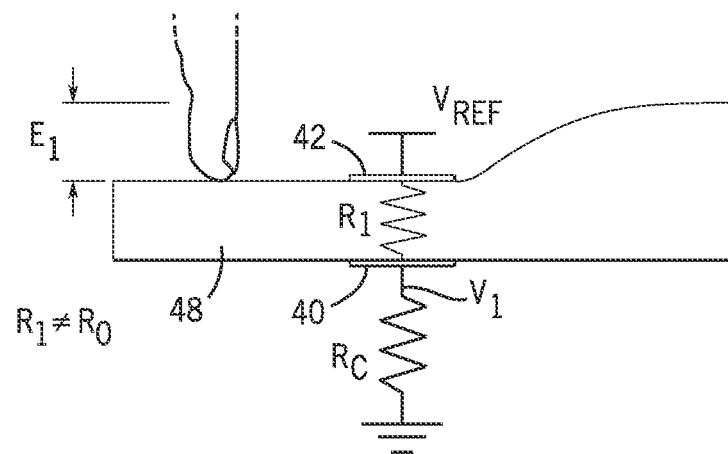
Figure 11A:
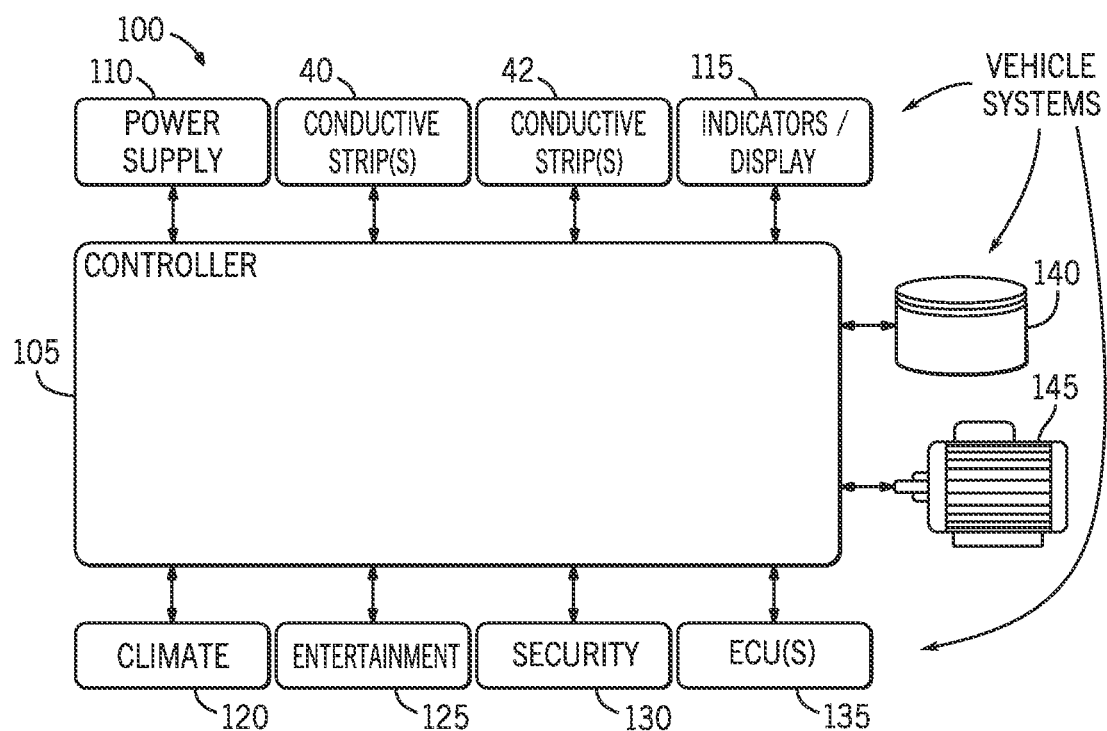
FIGS. 11A and 11B are schematic block diagrams of a configuration of a user interface system according to an exemplary embodiment.
Figure 11B:
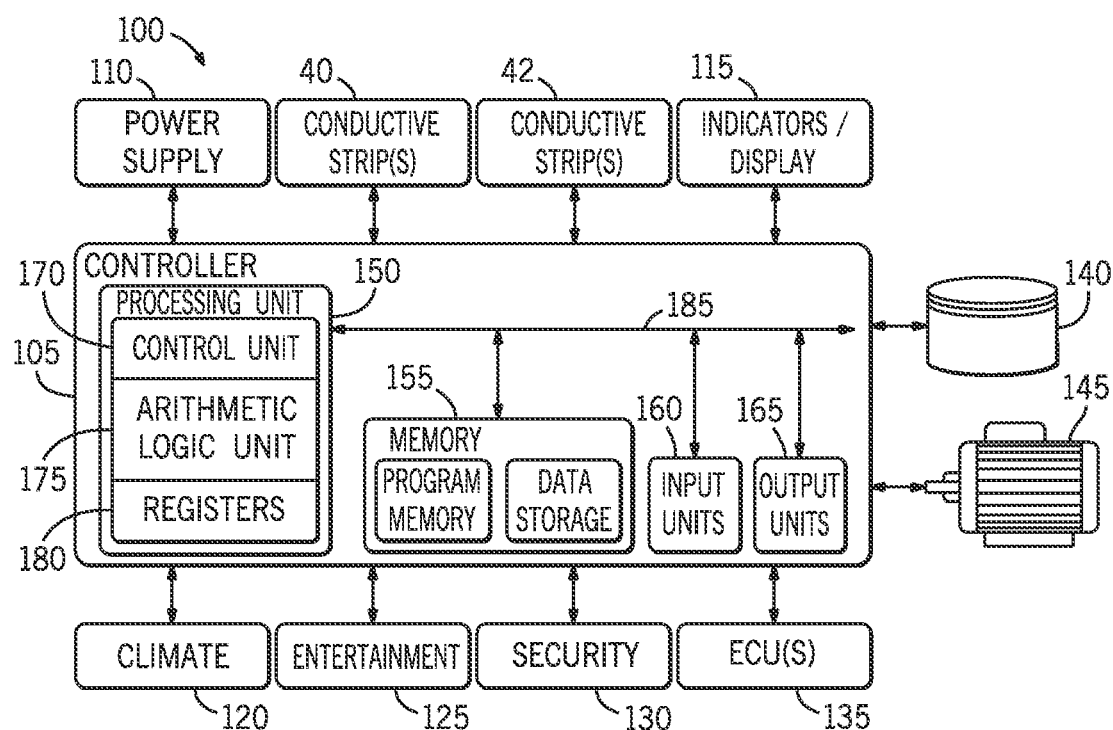

According to an exemplary embodiment shown schematically in FIGS. 11A and 11B the user interface may comprise a controller/control system 105 configured to implement user input at user interface 24 through operation of vehicle systems. See also FIGS. 1B-1D, 6A-6H, and 10A-10B. As indicated schematically in FIG. 11A a user interface system may comprise any of a wide variety of controllers/processors compatible and configurable for use in a vehicle to operate vehicle systems.

FIG. 11B illustrates a control system 100 associated with a vehicle and the trim panel 20. The system 100 includes a controller 105 that is electrically and/or communicatively connected to a variety of modules, components, or electronic control units ("ECUs") associated with the vehicle. For example, the illustrated controller 105 is connected to the conductive strips 40, the conductive strips 42, a power supply module 110, one or more indicators/displays 115, a climate control module 120, and entertainment control module 125, a security control module 130, one or more additional or different ECUs 135 associated with the vehicle, a data store or database 140, and a motor 145. The controller 105 includes combinations of hardware and software that are operable to, among other functions, control the operation of the various control modules 120-135, access data from or store data in the data store 140, control the operation of the motor 145, activate the one or more indicators/displays 115, etc. As shown according to an exemplary embodiment in FIG. 11B, the controller 105 is connected to, for example, the data store 140 or the motor 145 to directly control the operation or performance of the data store 140 or motor 145. According to an exemplary embodiment, the controller 105 is connected to an intermediate control module or control unit 120-135 configured to provide control signals to components or modules associated with the vehicle.

According to an exemplary embodiment, the controller 105 includes a plurality of electrical and electronic components that provide power, operational control, and protection to the components and modules within or connected to the controller 105 and/or associated with the vehicle. For example, the controller 105 includes, among other things, a processing unit 150 (e.g., a microprocessor, a microcontroller, or another suitable programmable device), a memory 155, input units 160, and output units 165. The processing unit 150 includes, among other things, a control unit 170, an arithmetic logic unit (ALU) 175, and a plurality of registers 180 (shown as a group of registers in FIG. 11B), and is implemented using a known computer architecture. The processing unit 150, the memory 155, the input units 160, and the output units 165, as well as the various modules connected to the controller 105 are connected by one or more control and/or data buses (e.g., common bus 185). The control and/or data buses are shown generally in FIG. 11B according to an exemplary embodiment. The use of one or more control and/or data buses for the interconnection between and communication among the various modules and components would be known to a person skilled in the art in view of the invention described herein. According to an exemplary embodiment, the controller 105 is implemented partially or entirely on a semiconductor (e.g., a field-programmable gate array ["FPGA"] semiconductor) chip, such as a chip developed through a register transfer level ("RTL") design process.

The memory 155 includes a program storage area and a data storage area. The program storage area and the data storage area can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The processing unit 150 is connected to the memory 155 and executes software instructions that are capable of being stored in a RAM of the memory 155 (e.g., during execution), a ROM of the memory 155 (e.g., on a generally permanent basis), or another non-transitory computer readable medium such as another memory or a disc. Software included in the implementation of the system 100 can be stored in the memory 155 of the controller 105. The software includes firmware, one or more applications, program data, filters, rules, one or more program modules, and other executable instructions. The controller 105 is configured to retrieve from memory and execute, among other things, instructions related to the control methods described herein. According to an exemplary embodiment, the controller 105 includes additional, fewer, or different components.

The power supply module 110 supplies a voltage to the controller 105 or other components or modules of the system 100. The power supply module 110 is, for example, a 12V vehicle battery (e.g., a 12V lead acid battery) or a grid-independent power source (e.g., a generator, a solar panel, etc.).

According to an exemplary embodiment, the indicators/display 115 includes a liquid crystal display ("LCD"), a light-emitting diode ("LED") display, an organic LED ("OLED") display, a thin-film transistor ("TFT") LCD, LEDs, speakers, motors, etc., to provide visual, auditory, tactile, or haptic indications of the status or conditions of the system 100, etc. The indicators/display 115 can be configured to display conditions or data associated with the system 100 in real-time or substantially real-time. For example, the indicators/display are configured to display measured operational characteristics or settings of the vehicle, the status of the vehicle, climate settings, entertainment settings, security settings/status, etc.

According to an exemplary embodiment, the input units 160 and output units 165 correspond at least to the number of inputs and outputs for the desired grid resolution of the trim panel 20 (e.g., the number of conductive strips in the first and second sets of conductive strips 40, 42). The controller 105 is configured to monitor the input units 160 and provide output voltages to the output units 165 when performing the pressure sensing. According to an exemplary embodiment, the controller 105 performs a calibration or initialization to determine baseline voltage values at each of the input units 160. For example, when initialized, the controller 105 sequentially reads voltages at the input units 160 from the conductive strips 42. The sensed or monitored voltage values are stored in the memory 155 as baseline values. The baseline input voltage values are then used to determine when pressure is being applied to the trim panel 20, as shown in FIG. 10A.

During operation, the controller selectively outputs voltages using the output units 165 to one or more of the conductive strips 40. According to an exemplary embodiment, the conductive strips 40 are connected directly to a voltage source. According to an exemplary embodiment, the controller 105 provides an output voltage to one of the conductive strips 40. According to an exemplary embodiment, the controller 105 provides output voltages to a plurality of the conductive strips 40 or each of the conductive strips 40. According to an exemplary embodiment, controller 105 is configured to provide an output voltage to one of the conductive strips 40. When the controller 105 is providing the output to the conductive strip 40, the controller selectively (e.g., sequentially, in parallel, etc.) monitors the input units from the conductive strips 42. According to an exemplary embodiment, a scanning technique is performed at a rate of greater than approximately 30 Hz. According to an exemplary embodiment, the scanning rate can vary (e.g., be greater than 30 Hz or less than 30 Hz) depending on, for example, the type of parameter being controlled (e.g., climate, entertainment, security, etc.), or the number of inputs.

According to an exemplary embodiment, upon a comparison of the baseline voltage value to the monitored voltage value from the conductive strips 42, a change in voltage greater than a threshold value is detected (e.g., 0.1 Volts, 0.01 Volts, 1% of voltage range, 5% of voltage range, 10% of voltage range, etc.), the controller 105 determines that pressure has been applied to the trim panel 20. The location of the pressure is identified based on the output unit 165 to which an output voltage was applied and the input unit 160 on which the change in voltage was detected. According to an exemplary embodiment, the corresponding input unit(s) 160 and output unit 165 correspond to coordinates within a look-up table which the controller 105 uses to identify the pixels of the trim panel 20 being pressed. According to an exemplary embodiment, the controller 105 generates a map or matrix of voltage changes for each pixel of the trim panel 20. The mapping of voltage changes is then used to identify points of pressure on the trim panel 20.

According to an exemplary embodiment, the amount of voltage change detected (i.e., from the baseline) can correspond to different degrees of pressure being applied to the trim panel 20. For example, a relationship between the pressure applied to the trim panel and a corresponding change in voltage detected by the controller 105 can be linear, nonlinear, exponential, etc. According to an exemplary embodiment, the controller 105 can modify (e.g., increase or decrease) sensitivities to applied pressure based on the driver, the type of parameter being controlled (e.g., climate, entertainment, security, etc.), etc. Using a look-up table or an algorithm stored in, for example, the memory 155, the controller can associate a detected change in voltage with an amount of applied pressure. Measuring variable pressure enables the interface 24 (or the controller 105 coupled with the interface) to distinguish between different types of touching (e.g., brushing, light touch, hard touch) which can enable pressure sensitive control actions coupled to the interface 24. A parameter of the controlled element (e.g., speed or amount of change) may be dependent on the amount of pressure sensed. For example, the greater the pressure applied to the trim panel 20, the faster the parameter is changed.

For example, a vibration generator may be coupled to the trim panel 20 and responsive to vibrate the interface 24 upon the controller 105 determining that a pressure in excess of one or more threshold actuation pressures has been applied to the interface 24.

The pressure sensing interface 24 can be coupled with one or more vehicle systems (e.g., modules 120-135, motor 145, data store 140, etc.) to provide user control to one or more on-off states or other adjustable parameters. For example and without limitation, the pressure sensing interface 24 can be coupled through the controller 105 and/or control modules 120-135 to an entertainment system (e.g., radio, DVD movie player, etc.), an information system (e.g., navigation, back-up camera, trip computer, etc.), climate controls (e.g., temperature, fan speed, air conditioning, vent control), door locks, window regulators, seat position adjusters, cruise control, mirror position adjusters, headlights, and/or a steering wheel adjuster.

The interface 24 and the covering 32 may be provided with indicia identifying certain areas of the interface 24 that are associated with certain vehicle controls via the controller. The indicia may take many various forms including embossing, screen printing, bonded decals, and stitching.

As an armrest, the trim panel 20 having the integral pressure sensing interface 24 can take the form of virtually any other interior vehicle component as desired. For example, the pressure sensing interface 24 can be constructed as part of a headliner, dashboard, center console, door panel, steering wheel, seat, floor, roof pillar trim, etc. Although the pressure sensing interface 24 can be connected to an indicator or display (e.g., a digital display screen), the pressure sensing interface 24 itself does not form a display screen. The pressure sensing interface 24 is built into existing, non-display portions of a vehicle interior. According to an exemplary embodiment, a component of interior trim not conventionally used as a vehicle control user interface can be adapted to provide such function to enhance the user experience of a conventional automobile.

Figure 12A:
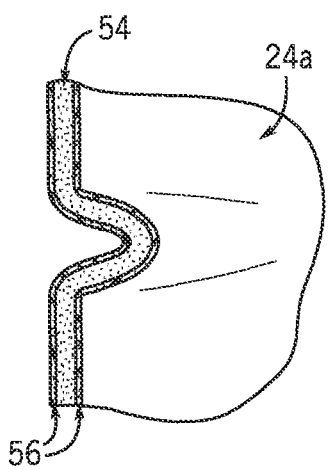
FIGS. 12A and 12B are schematic diagrams of operation of the user interface system for a vehicle system shown as a vehicle window according to an exemplary embodiment.
Figure 12B:
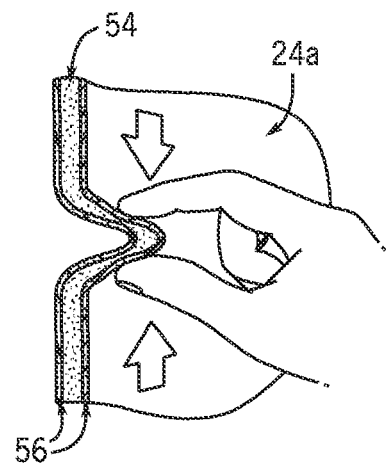
Figure 12C:
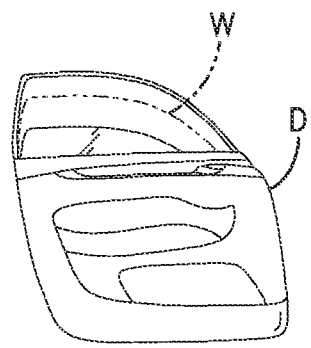
FIG. 12C is a schematic diagram of the vehicle window operated by the user interface system of FIGS. 12A and 12B according to an exemplary embodiment.
Figure 12D:
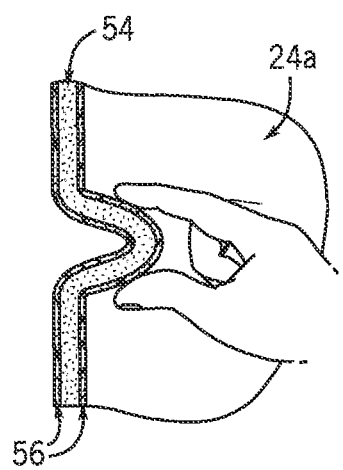
FIGS. 12D and 12E are schematic diagrams of operation of the user interface system for a vehicle system shown as a vehicle seat according to an exemplary embodiment.
Figure 12E:
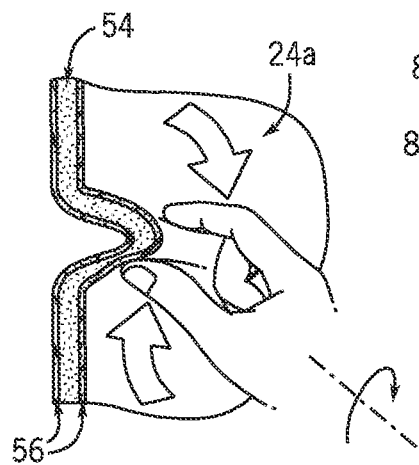

With reference to FIGS. 12A through 12F, a pressure sensing interface 24a is shown including a sensor grid 54 positioned between two deformable material layers 56. According to an exemplary embodiment, the sensor grid 54 is made up of two sets of conductive strips 40, 42 and an intermediate layer 48 (e.g., carbon foam) and is operable with the pressure sensing interface 24 shown in FIGS. 1 through 17C. According to an exemplary embodiment, in addition to being sensitive to a push gesture (FIG. 15B), the pressure sensing interface 24a is also sensitive to a pinch gesture (FIG. 12B) and a twist gesture (FIG. 12E). In a pinch gesture, the pressure sensing interface 24a is pinched between two fingers acting in opposing and converging directions. According to an exemplary embodiment, in a twist gesture, the pressure sensing interface 24a is grasped and twisted by at least two fingers moving in an offset rotational direction.

FIGS. 13 through 14F show a pressure sensing interface 24b of an automotive seat control system, which also includes a controller (not shown) like the controller 105 shown in FIG. 11B that is in communication with the interface 24b. The pressure sensing interface 24b is identical to the interface 24a shown in FIGS. 12A through 12F, and will not be described again in detail. As shown in FIG. 13, the pressure sensing interface 24b is located along the side of a seat portion 84 of a vehicle seat 82. According to an exemplary embodiment, the pressure sensing interface 24b may be located on a back portion 98 of the seat 82. The interface 24b includes two generally flat push-button regions 86 responsive to push gestures and a protruding region 88 responsive to push gestures and twist gestures. According to an exemplary embodiment, the push-button regions 86 of the interface 24b control movement of the vehicle seat 82 forwards and backwards, while the protruding region 88 controls movement of the seat portion 84 and the back portion 98 of the seat 82. Although not shown in FIG. 13, the interface 24b may include a rigid backing member 64 (see FIGS. 15A and 15B) to create the protruding region 88.

With reference to FIG. 13, the protruding region 88 is separated into four zones 88A through 88D, with two zones 88A, 88B located on the upper side of the protruding region 88 and two zones 88C, 88D located on the lower side of the protruding region 88. Markings associated with the zones 88A through 88D on the protruding region 88 are not required; according to an exemplary embodiment, markings (e.g., arrows, etc.) may be used to describe the controls provided by the protruding region 88.

According to an exemplary embodiment shown schematically in FIG. 14A, pressing down on zone 88a produces a push gesture which moves the seat 82 forward. According to an exemplary embodiment shown schematically in FIG. 14B, pressing down on zone 88b produces a push gesture which moves the seat 82 toward the rear. According to an exemplary embodiment, as shown in FIG. 14C, pressing down on zone 88a and up on zone 88d produces a twist gesture which straightens the back portion 98 or moves the back portion 98 of the interface 24b into a more upright position. According to an exemplary embodiment shown schematically in FIG. 14D, pressing up on zone 88c and down on 88b produces an opposite twist gesture, which reclines the back portion 98 or moves the back portion 98 towards a laid-down position. According to an exemplary embodiment shown schematically in FIG. 14E, the seat 84 can be lowered by applying pressure to zones 88a and 88b. According to an exemplary embodiment shown schematically in FIG. 14F, the seat can be raised by applying pressure to zones 88c and 88d. According to an exemplary embodiment, the pressure sensing interface 24b may be sensitive to the magnitude of the force or pressure applied to the push-button regions 86 and/or the protruding region 88. For example, the speed at which the seat 82 is movable may be dependent on the magnitude of the force or pressure applied to the interface 24b.

Figure 15A:
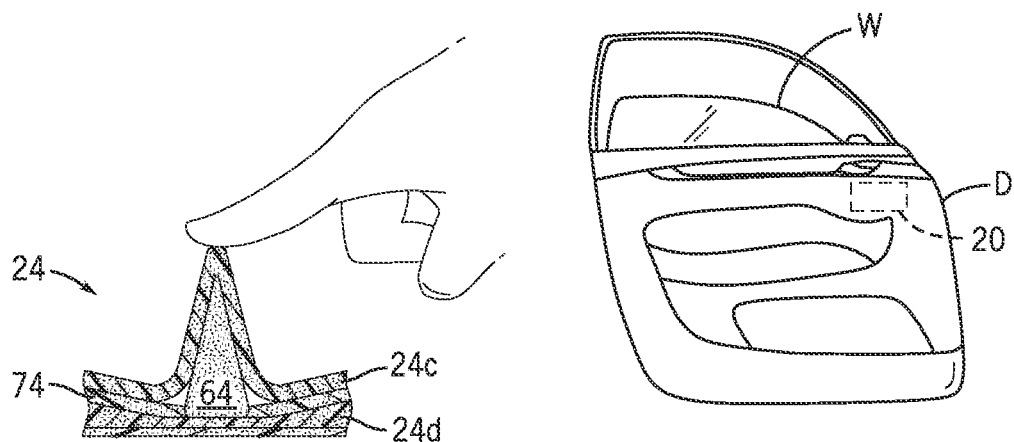
FIGS. 15A and 15B are schematic cross-section views and schematic diagrams of operation of the user interface system for a vehicle system shown as a vehicle window according to an exemplary embodiment.
Figure 15B:
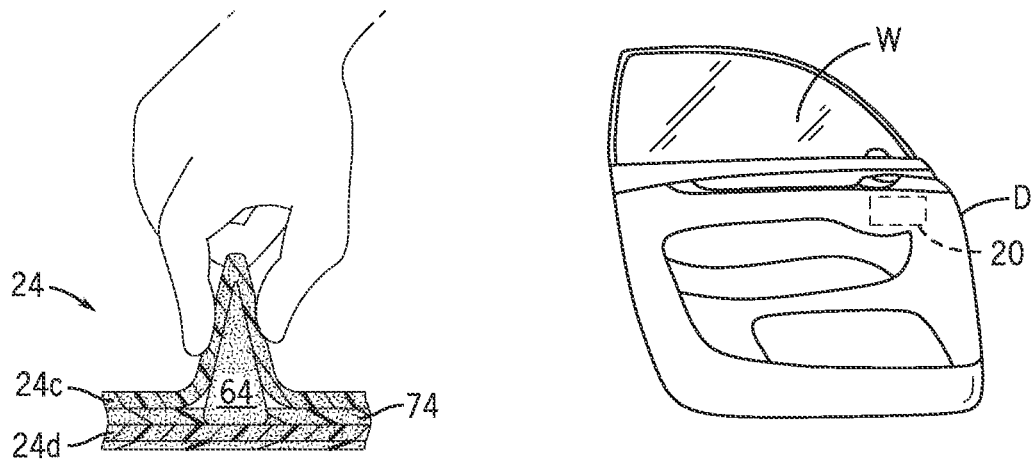
Figure 15C:
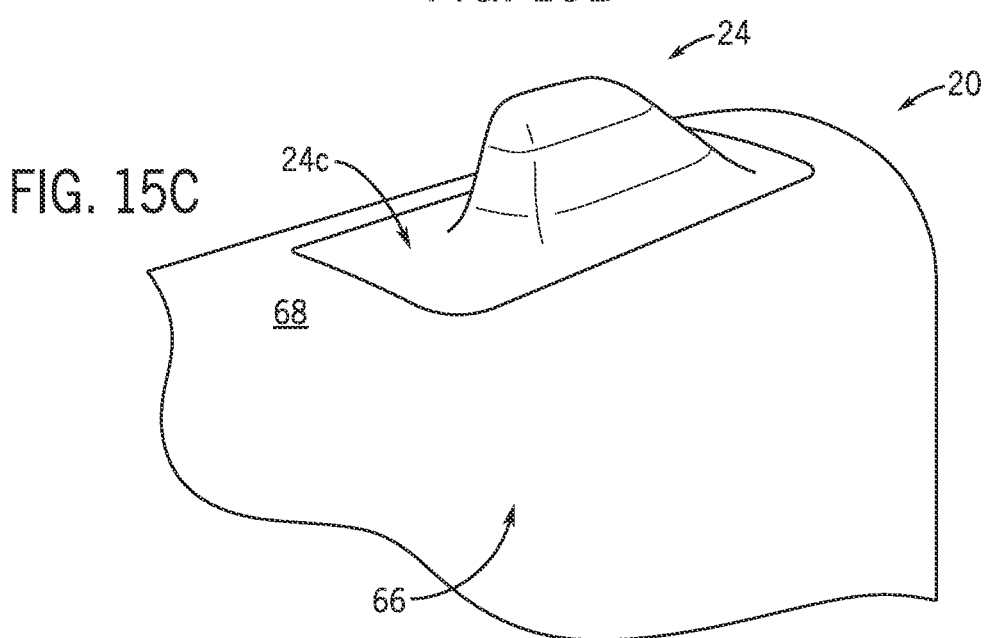
FIG. 15C is a perspective view of the user interface system according to an exemplary embodiment.

FIGS. 15A through 15C show pressure sensing interfaces 24c, 24d of an automotive window control system, which also includes a controller (not shown) like the controller 105 shown in FIG. 11B that is in communication with the interfaces 24c, 24d. The pressure sensing interfaces 24c, 24d are identical to the interface 24a shown in FIGS. 12A through 12F. As shown in FIGS. 15A through 15C, the pressure sensing interfaces 24c, 24d are located on an upper surface 68 of a door panel 66. According to an exemplary embodiment, the interfaces 24c, 24d may be positioned within the vehicle interior in other locations typically associated with placement of window controls. As shown in FIGS. 15A and 15B, a non-conductive cushion layer 74 is positioned between the interfaces 24c, 24d, and a rigid backing member 64 is positioned beneath the interface 24c to impart a protruding shape or contour to the interface 24c. The pressure sensing interfaces 24c, 24d control a window with a pinch gesture (FIG. 15A) to raise the window, or a push gesture (FIG. 15B) to lower the window. According to an exemplary embodiment, the pressure sensing interfaces 24c, 24d may be sensitive to the magnitude of applied force or pressure. For example, the speed at which the window is raised and/or lowered may be dependent upon the magnitude of the force or pressure applied to interfaces 24c, 24d. The interfaces 24c, 24d may be sensitive to the duration of applied force or pressure. For example, a brief pinch gesture of the interface 24c could completely raise the window quickly, or a brief push gesture of the interface 24d could completely lower the window quickly. According to an exemplary embodiment, a pinch gesture could raise the window slowly, while a simultaneous pinch gesture and push gesture could raise the window at a faster speed. According to an exemplary embodiment, a pinch gesture could raise the window at a constant speed until released, while a simultaneous pinch gesture and push gesture could automatically raise the window until the window is in a fully closed position. According to an exemplary embodiment, a pinch gesture could do nothing if not combined with a push gesture.

FIGS. 16A through 16C illustrate pressure sensing interfaces 24e, 24f according to an exemplary embodiment of an automotive window control system; the window control system also includes a controller (not shown) like the controller in FIG. 11B that is in communication with the interfaces 24e, 24f. The pressure sensing interfaces 24e, 24f are identical to the interface 24a shown in FIGS. 12A through 12F. As shown in FIGS. 16A through 16C, the pressure sensing interfaces 24e, 24f are mounted on a generally vertical surface 72 of the door panel 66. According to an exemplary embodiment, the interfaces 24e, 24f may be positioned within the vehicle interior in other locations typically associated with placement of window controls. The interfaces 24e, 24f are attached to a rigid substrate 52 that imparts a protruding shape or contour to each of the interfaces 24e, 24f, and that provides sufficient structural rigidity to oppose the push gesture as shown in FIGS. 16A and 16B. According to an exemplary embodiment of the interfaces 24e, 24f, a downward push gesture (FIG. 16A) on the interface 24e lowers the window and the upward push gesture (FIG. 16B) raises the window. According to an exemplary embodiment, the pressure sensing interfaces 24e,

24f may be sensitive to the magnitude of applied force or pressure. For example, the speed at which the window is raised and/or lowered may be dependent upon the magnitude of the force or pressure applied to interfaces 24e, 24f. The interfaces 24e, 24f may be sensitive to the duration of applied force or pressure. For example, a brief push gesture on the interface 24f could completely raise the window quickly, or a brief push gesture of the interface 24e could completely lower the window quickly.

FIGS. 14A through 16C schematically show applications of the pressure sensing interface 24a (FIGS. 12A through 12F) with respect to window and seat controls, but the scope of the invention should not be limited to particular applications. According to an exemplary embodiment, the interface 24a could be used for opening a glovebox or center console, unlocking, locking, opening, or closing a door, opening or closing a trunk, dimming a mirror, lowering a visor, activating cruise control, changing gears, adjusting lights or radio functions, or applying an emergency brake.

The present inventions have been described with reference to exemplary embodiments; variations and modifications exist within the scope and spirit of one or more aspects of the inventions.

Additional Embodiments

Figure 6A:
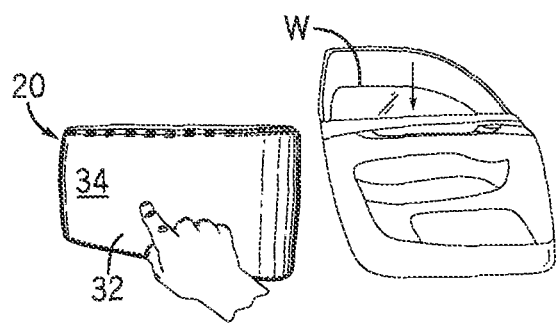
FIGS. 6A through 6H are schematic perspective views of operation of the user interface system for a vehicle interior component according to an exemplary embodiment.
Figure 6B:
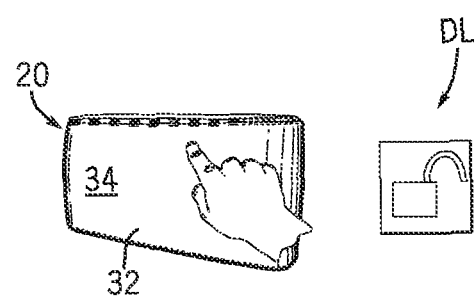
Figure 6C:
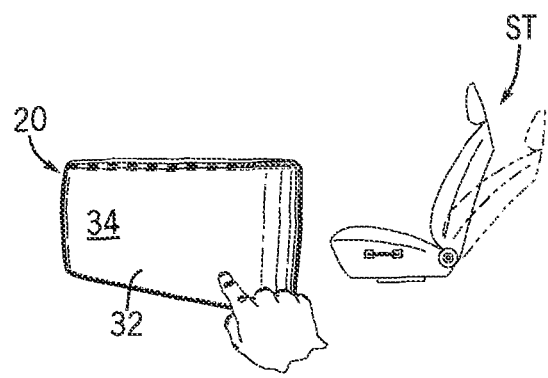
Figure 6D:
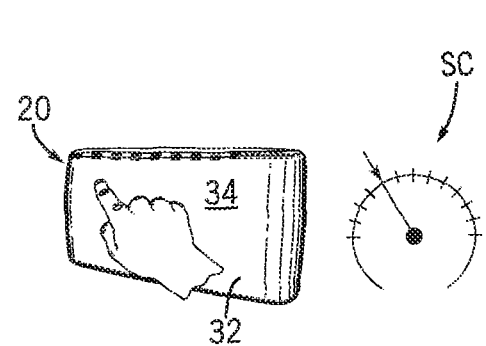
Figure 6E:
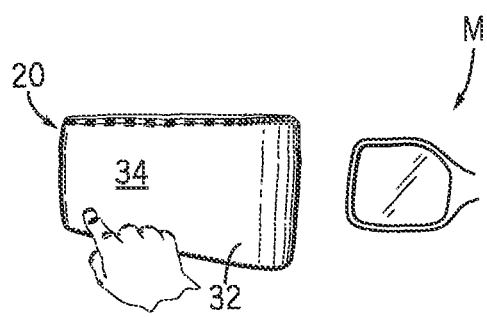
Figure 6F:
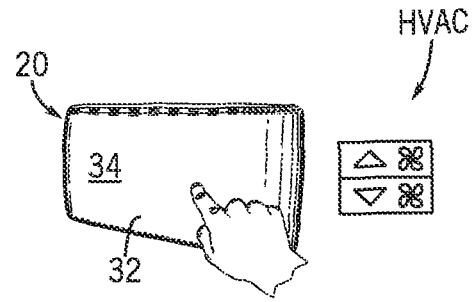
Figure 6G:
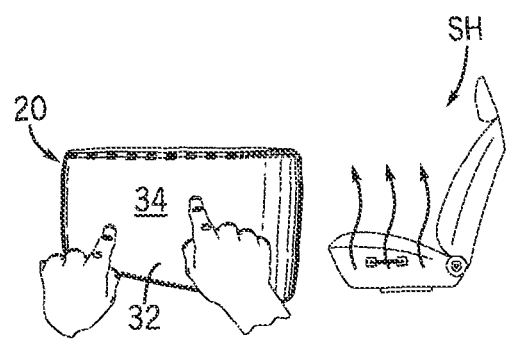
Figure 6H:
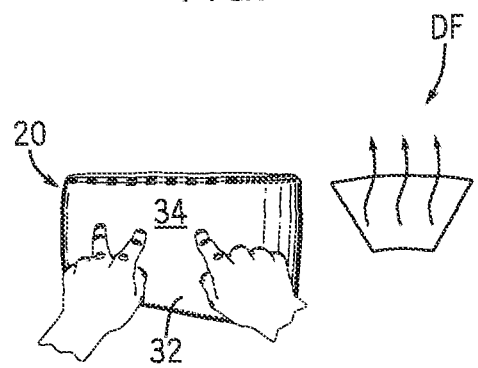
Figure 7A:
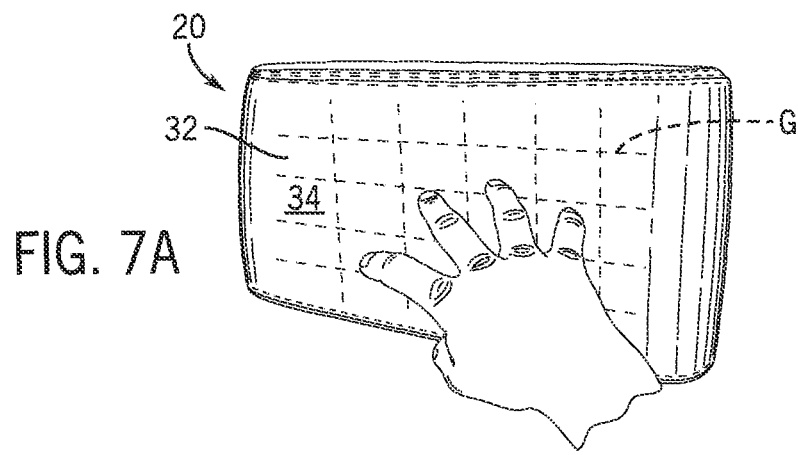
FIGS. 7A through 7C are schematic perspective views of operation of the user interface system for a vehicle interior component according to an exemplary embodiment.
Figure 7B:
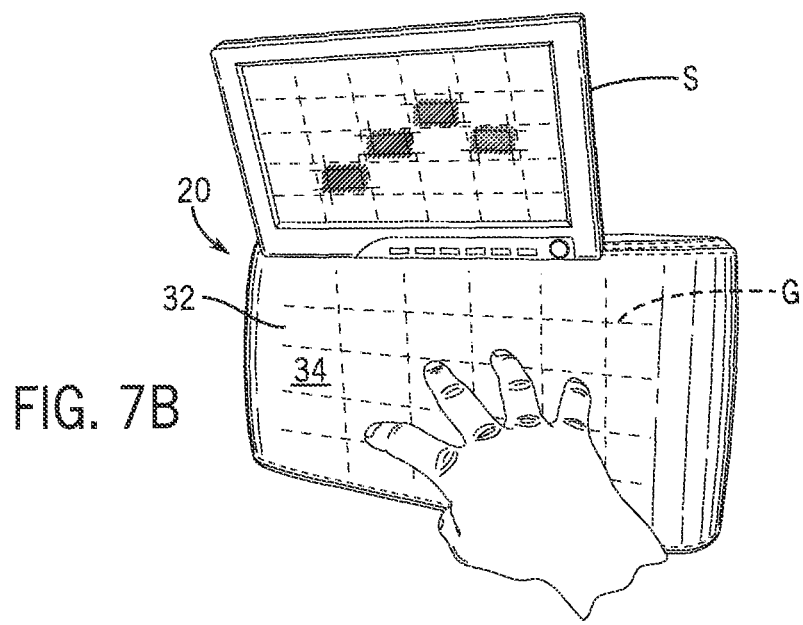
Figure 7C:
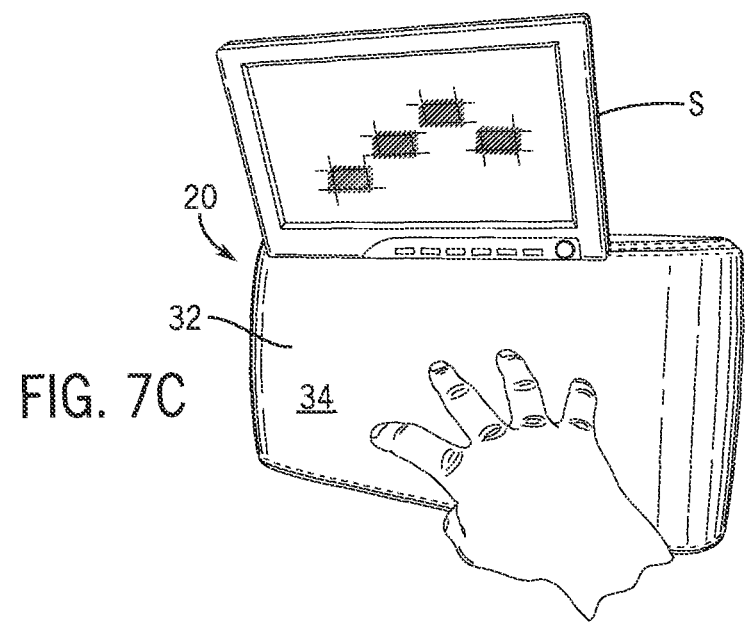

According to an exemplary embodiment shown schematically in FIGS. 6A through 6H the user interface system 20 can be used to operate any of a wide variety of vehicle interior systems. For example a door window as shown in FIG. 6A, a door lock shown in FIG. 6B, a seat shown in FIG. 6C, a speed control system shown in FIG. 6D, a mirror shown in FIG. 6E, a heating, ventilation and air conditioning system FIG. 6F, a seat heater shown in FIG. 6G, or a defroster shown in FIG. 6H.

According to an exemplary embodiment shown schematically in FIGS. 3B, 7A through 7C, 8, and 9, the user interface system 20 comprises a grid G configured within the automotive interior component (such as trim panel 20). A vehicle interior component with user interface system 20 comprises a grid G providing a user interface 24 for use by a vehicle occupant. As shown schematically in FIGS. 3B, 7A and 8, the grid G provides user interface 24 for input from a vehicle occupant to control or operate vehicle systems. See also FIGS. 7B and 7C (user interface system 20 with display screen F and control panel P).

According to an exemplary embodiment shown schematically in FIG. 10A, the sensor for the user interface system can be configured in a variety of configurations; for example, the conductive strips 40 on the base 28 of the sensor may be provided in an arranged side-by-side (parallel) configuration or in an overlapping configuration arranged to contact with the conductive layer.

Figure 10C:
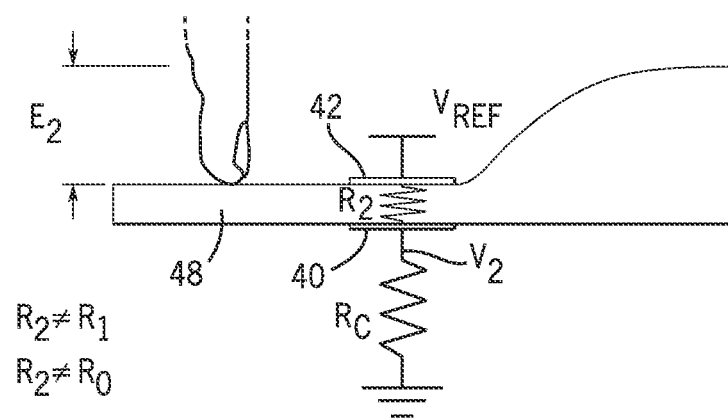

According to an exemplary embodiment shown schematically in FIGS. 10A through 10C the user interface system (e.g. grid G providing the user interface for the vehicle interior component) may be configured to operate by variations in electrical signals (e.g. resistance/voltage). As indicated schematically in FIG. 10A, an element of the grid G in a default position will provide a default resistance $R_0$ established by the electrical properties of the materials (e.g. layer 48) and a voltage $V_0$ measurement (e.g. at a sensor). As indicated schematically in FIG. 10B, manipulation of layer 48, for example compression by touch input $E_1$ from a vehicle occupant will cause a variation in resistance $R_1$ established by the electrical properties of the materials (e.g. layer 48) and a corresponding variation in voltage $V_1$ (e.g. at the sensor); a signal corresponding to touch input $E_1$ can be correlated to an output signal from the user interface system to operate a vehicle system in a particular designated manner (see e.g. FIG. 6A-6H). As indicated schematically in FIG. 10C, manipulation of layer 48, for example compression by touch input $E_2$ from a vehicle occupant will cause a variation in resistance $R_2$ established by the electrical properties of the materials (e.g. layer 48) and a corresponding variation in voltage $V_2$ (e.g. at the sensor); a signal corresponding to touch input $E_2$ can be correlated to an output signal from the user interface system to operate a vehicle system in a particular designated manner (see e.g. FIG. 6A-6H). For example, input $E_1$ (e.g. a slight touch) may operate a vehicle system in one manner while touch input $E_2$ (e.g. a heavier touch) will operate the vehicle system in a different manner.

According to an exemplary embodiment shown schematically in FIGS. 12A through 12C, a user interface 24A is shown including a sensor grid 54 positioned between two material layers 56. The sensor grid 54 is comprised of two sets of conductive strips and an intermediate layer that exhibits a variable electrical resistance when compressed, for example by pressure or force applied by a vehicle occupant. A controller is operable to identify a user input by monitoring the electrical resistance between the first and second sets of conductive strips. In response to a pinch gesture, the electrical resistance between the first and second sets of conductive strips changes, for example decreases. The change in resistance is sensed as a change in voltage, and the change in voltage is calibrated with respect to a threshold voltage change and used to generate a control signal, for example, to close a vehicle window. See FIG. 12C. Referring to FIG. 12B, a user input indicated as a pinch is shown schematically (e.g. as to operate a vehicle system shown as window W of car door D).

Figure 12F:
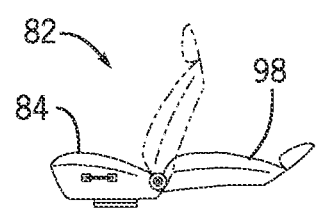
FIG. 12F is a schematic diagram of the vehicle seat operated by the user interface system of FIGS. 12D and 12E according to an exemplary embodiment.

According to an exemplary embodiment shown schematically in FIGS. 12D through 12F, a user interface 24a is shown including a sensor grid 54 positioned between two material layers 56. The sensor grid 54 is made up of two sets of conductive strips and an intermediate layer that exhibits a variable electrical when compressed, for example by pressure or force applied by a vehicle occupant. A controller is operable to identify a user input by monitoring the electrical resistance between the first and second sets of conductive strips. The sensor grid 54 of the user interface 24a is shown as being compressed successively in different portions in response to a twist gesture. The electrical resistance between the first and second sets of conductive strips changes in the different portions of the sensor grid 54. The changes in resistance are sensed as changes in voltage, and the changes in voltage are calibrated with respect to a threshold voltage change and used to generate a control signal, for example, to rotate the vehicle seat back 98. Referring to FIG. 12D, a user input indicated as a twist is shown schematically (e.g. as to operate a vehicle system shown as a seat 82).

According to an exemplary embodiment shown in FIG. 13, a protruding region 88 is separated into four zones 88A through 88D, with two zones 88A, 88B located on the upper side of the protruding region 88 and two zones 88C, 88D located on the lower side of the protruding region 88. Markings associated with the zones 88A through 88D on the protruding region 88 are not required; according to an exemplary embodiment, markings (e.g., arrows, etc.) may be used to describe the controls provided by the protruding region 88.

According to an exemplary embodiment shown schematically in FIG. 13, a user interface 24b comprises external surfaces 86 responsive to push gestures to control movement of a vehicle seat forward and backward and a region 88 responsive to push gestures and twist gestures to control movement of a cushion portion and a back portion of a vehicle seat. The region 88 is separated into four zones 88A through 88D, with two zones 88A, 88B located on the upper side of the region 88 and two zones 88C, 88D located on the lower side of the region 88.

According to an exemplary embodiment shown schematically in FIGS. 14A through 14F, a user interface of an automotive seat control system is shown located on the side of a cushion portion 84 of a vehicle seat 82. According to an exemplary embodiment, the user interface 24b may be located on a back portion 98 of the vehicle seat 82. The user interface 24b includes four regions responsive to push gestures and twist gestures.

According to an exemplary embodiment shown schematically in FIG. 14A, in response to a push gesture, the vehicle seat 82 moves forward. The pressure user interface may be sensitive to the magnitude of the force or pressure applied. For example, the speed at which the seat 82 moves forward may be dependent on the magnitude of the force or pressure applied to the interface.

According to an exemplary embodiment shown schematically in FIG. 14B, in response to a push gesture, the vehicle seat 82 moves rearward. The user interface may be sensitive to the magnitude of the force or pressure applied. For example, the speed at which the seat 82 moves rearward may be dependent on the magnitude of the force or pressure applied to the interface.

According to an exemplary embodiment shown schematically in FIG. 14C, in response to a twist gesture, the vehicle seat back 98 rotates forward. The user interface may be sensitive to the magnitude of the force or pressure applied. For example, the speed at which the seat back 98 rotates forward may be dependent on the magnitude of the forces or pressures applied to the interface.

According to an exemplary embodiment shown schematically in FIG. 14D, in response to a twist gesture, the vehicle seat back 98 rotates rearward. The user interface may be sensitive to the magnitude of the force or pressure applied. For example, the speed at which the seat 82 rotates rearward may be dependent on the magnitude of the forces or pressures applied to the interface.

According to an exemplary embodiment shown schematically in FIG. 14E, in response to a push gesture, the vehicle seat 82 moves downward. The user interface may be sensitive to the magnitude of the force or pressure applied. For example, the speed at which the seat 82 moves downward may be dependent on the magnitude of the forces or pressures applied to the interface.

According to an exemplary embodiment shown schematically in FIG. 14F, in response to a push gesture, the vehicle seat 82 moves upward. The user interface may be sensitive to the magnitude of the force or pressure applied. For example, the speed at which the seat 82 moves upward may be dependent on the magnitude of the forces or pressures applied to the interface.

According to an exemplary embodiment shown schematically in FIGS. 15A through 15C, a user interface system is shown comprising interfaces 24c and 24d, each including a sensor grid comprised of two sets of conductive strips and an intermediate layer that exhibits a variable electrical resistance in response to applied pressure. A controller is operable to identify user inputs within the sensor grids by monitoring the electrical resistance between the first and second sets of conductive strips. The interfaces 24c and 24d are mounted on a surface 68 of a vehicle door panel 66. According to an exemplary embodiment, the interfaces 24c and 24d may be positioned within a vehicle interior. A non-conductive cushion layer 74 is positioned between the interfaces 24c, 24d, and a rigid backing member 64 is positioned beneath the interface 24c to impart a protruding shape or contour to the interface 24c.

According to the exemplary embodiment shown schematically in FIG. 15A, in response to a downward push gesture, a vehicle window W opens. The interface 24d may be sensitive to the magnitude of the force or pressure applied. For example, the speed at which the window W opens may be dependent on the magnitude of the force or pressure applied to the interface 24d. The interface 24d may be sensitive to the duration of an applied force or pressure. For example, a brief push gesture on the interface 24d could fully lower the window.

According to the exemplary embodiment shown schematically in FIG. 15B, in response to a pinch gesture, a vehicle window W opens. The interface 24c may be sensitive to the magnitude of the force or pressure applied. For example, the speed at which the window W closes may be dependent on the magnitude of the force or pressure applied to the interface 24c. The interface 24c may be sensitive to the duration of an applied force or pressure. For example, a brief pinch gesture on the interface 24c could fully close the window.

According to an exemplary embodiment shown schematically in FIGS. 16A through 16C, user interfaces 24e and 24f are shown, each including a sensor grid comprised of two sets of conductive strips and an intermediate layer that exhibits a variable electrical resistance in response to applied pressure. A controller is operable to identify user inputs within the sensor grids by monitoring the electrical resistance between the first and second sets of conductive strips. The user interfaces 24e and 24f are mounted on a surface 72 of a door panel 66. According to an exemplary embodiment, the user interfaces 24e and 24f may be positioned within a vehicle interior.

According to an exemplary embodiment shown schematically in FIG. 16A, in response to a downward push gesture, a vehicle window W opens. The user interface 24e may be sensitive to the magnitude of the force or pressure applied. For example, the speed at which the window opens may be dependent on the magnitude of the force or pressure applied to the user interface 24e. The user interface 24e may be sensitive to the duration of an applied force or pressure. For example, a brief push gesture on the interface 24f could fully lower the window.

According to the exemplary embodiment shown schematically in FIG. 16B, in response to an upward push gesture, a vehicle window W closes. The user interface 24f may be sensitive to the magnitude of an applied force or pressure. For example, the speed at which the window closes may be dependent on the magnitude of the force or pressure applied to the user interface 24f. The user interface 24f may be sensitive to the duration of an applied force or pressure. For example, a brief push gesture on the interface 24f could fully raise the window.

Figure 17A:
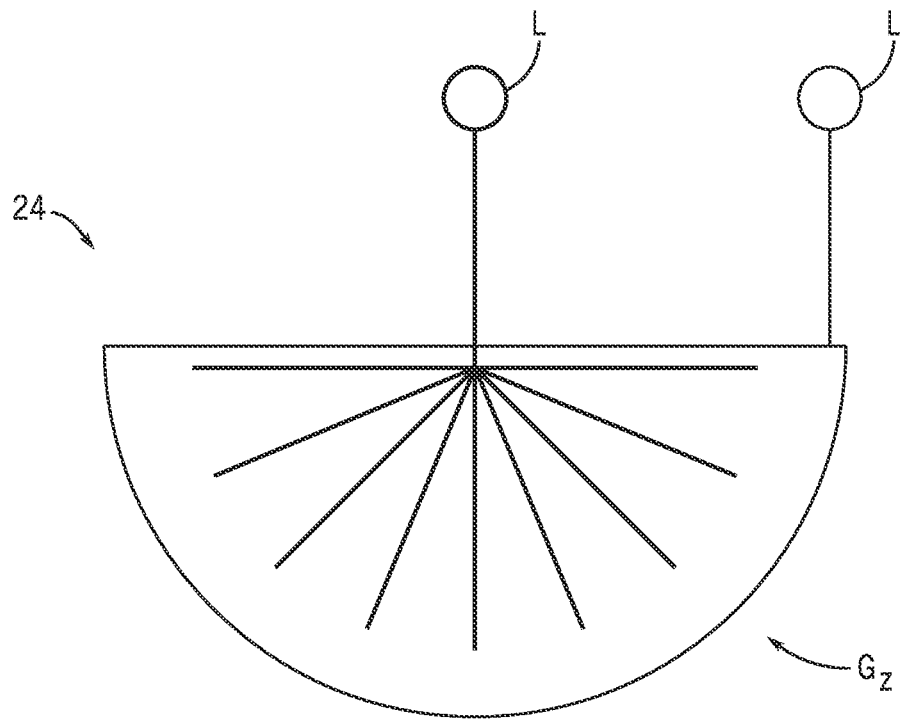
FIG. 17A is a schematic electrical diagram of a sensor for the user interface system according to an exemplary embodiment.
Figures 17B, 17C:
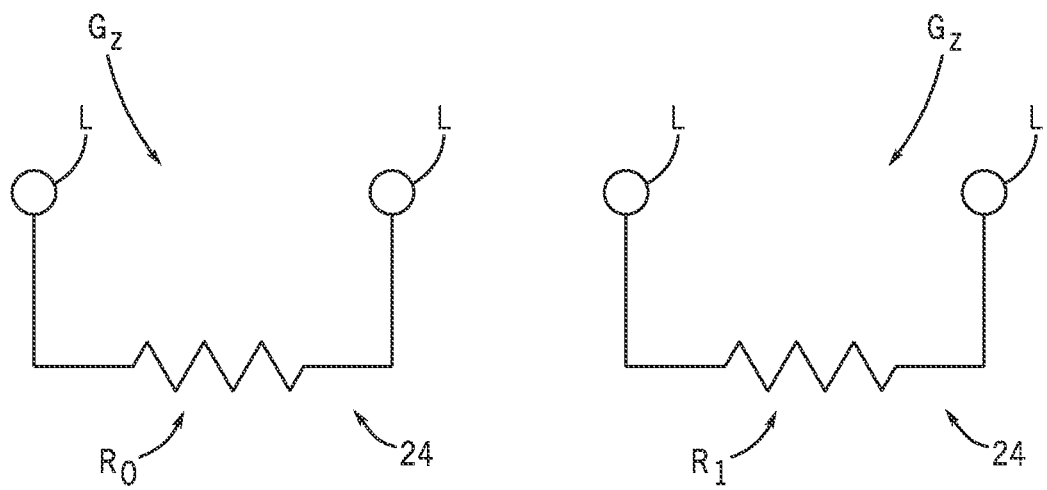
FIG. 17B is a schematic electrical diagram of the user interface system according to an exemplary embodiment.
FIG. 17C is a schematic electrical diagram of the user interface systems according to an exemplary embodiment.

According to an exemplary embodiment shown schematically in FIGS. 17A through 17C the grid Gz of the user interface system can be provided in a variety of configurations, for example a semi-circular configuration (See FIG. 17A). As indicated schematically in FIGS. 17B and 17C input (e.g. touch, twist, etc.) will create a variation in the resistance of the grid; variations in resistance of the grid can be calibrated (for example across a voltage divider circuit, current divider, electromagnetic sensor, capacitive sensor, etc.) to generate a signal at the user interface for control and/or operation of a vehicle system. As indicated, other grid configurations capable of dividing a signal based on user input through the grid may be employed according to exemplary embodiments of the user interface system. See also FIGS. 8, 9, and 10A-10C (showing electrical response of grid elements).

It is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting.

The embodiments described above and illustrated in the figures are presented by way of example only and are not intended as a limitation upon the concepts and principles of the present invention. As such, it will be appreciated by one having ordinary skill in the art that various changes in the elements and their configuration and arrangement are possible without departing from the spirit and scope of the present invention as set forth in the appended claims.

What is claimed is:

1. A vehicle interior component providing a user interface for an occupant of a vehicle at a non-translucent surface on a pressure-compressible material comprising:
    a base;
    a cover configured to provide a contact surface providing the user interface;
    a sensor grid between the cover and the base and configured to provide an electrical signal in response to input from the user interface at the contact surface;
    a controller; and
    a compressible layer comprising a deformable material between the cover and the base;
    wherein the user interface for the occupant of the vehicle is presented at the contact surface of the cover and integrated with the deformable material of the compressible layer and the sensor grid;
    wherein the sensor grid is configured so that input from the user interface comprises a variable electrical signal provided by applied pressure at the contact surface of the cover comprising at least one of (a) contact to the sensor grid at the contact surface by compressing the compressible layer; (b) contact to the sensor grid at the contact surface by deformation of the deformable material of the compressible layer;
    wherein the controller is configured for calibration and use of the variable electrical signal at the sensor grid as input at the user interface;
    wherein the deformable material of the compressible layer integrated with the user interface comprises a foam material;
    wherein the foam material comprising the deformable material of the compressible layer between the cover and the base comprises a deformable polyurethane foam material formed as a compressible polyurethane foam panel;
    wherein the cover comprises a non-translucent material providing the contact surface;
    wherein the non-translucent material of the cover comprises a flexible cover layer of at least one of (a) leather; (b) vinyl; (c) plastic; (d) wood; (e) textile fabric;
    wherein the deformable material of the compressible layer is configured to provide electrical properties detectable at the sensor grid and calibrated for operation of the user interface;
    wherein the electrical properties of the deformable material of the compressible layer comprise variation of electrical properties detectable at the sensor grid as a detected signal upon interaction at the deformable material of the compressible layer;
    wherein the user interface is configured to be operable upon interaction at the deformable material of the compressible layer by detection of variation of electrical properties by the detected signal at the sensor grid;
    wherein interaction at the deformable material comprises applied pressure at the contact surface of the cover;
    wherein the detected signal comprises the variable electrical signal;
    so that the user interface is presented across the deformable polyurethane foam material of the compressible layer and through the non-translucent material providing the contact surface of the cover.

2. The vehicle interior component of claim 1 wherein the contact surface comprises indicia identifying portions of the sensor grid with at least one of a display, embossing, screen printing, bonded decals, and stitching.

3. The vehicle interior component of claim 1 configured for operation by a vehicle occupant wherein the controller is further configured for at least one of (a) sending a signal to a control module, (b) controlling a motor, (c) providing a signal to a vehicle component, (d) providing electrical power to a vehicle component, (e) providing at least one of (1) visible feedback, (2) audible feedback, (3) tactile feedback, (4) haptic feedback to the vehicle occupant.

4. The vehicle interior component of claim 1 wherein the controller is configured to send a control signal to at least one of (a) an indicator, (b) a display, (c) a climate control module, (d) an entertainment control module, (e) a security control module, (f) an engine control unit, (g) a data store, (h) a database, (i) a motor, (j) a vehicle seat, (k) a window regulator.

5. The vehicle interior component of claim 1 wherein the foam material comprising the deformable material of the compressible layer between the cover and the base comprises at least one of (a) a non-conductive compressible substrate with a conductive additive, (b) carbon black particles interspersed within a non-conductive compressible substrate, (c) a polyurethane foam panel, (d) resilient compressible material.

6. The vehicle interior component of claim 1 comprising one of a trim panel, an armrest, a headliner, a dashboard, a console, a center console, a door panel, a steering wheel, a seat, an armrest adjacent a seat, a floor, a pillar, a roof pillar, pillar trim.

7. The vehicle interior component of claim 1 wherein the contact surface comprises at least one of (a) leather, (b) vinyl, (c) metal with an electrically insulating laminated layer, (d) plastic, (e) wood, (f) textile fabric; (g) a non-translucent material; (h) a flexible material; (i) a non-translucent and flexible material; (j) a non-conductive material.

8. The vehicle interior component of claim 1 wherein the sensor grid and the controller are configured to detect gripping of the contact surface.

9. The vehicle interior component of claim 1 wherein the sensor grid and the controller are configured to detect at least one of (a) depression of the contact surface; (b) pinching of the contact surface; (c) twisting of the contact surface; (d) contact to the sensor grid at the contact surface; (e) contact to the sensor grid at the contact surface by compressing the contact surface; (f) gripping of the contact surface.

10. The vehicle interior component of claim 1 wherein the sensor grid comprises strips; and wherein the strips of the sensor grid comprise at least one of conductive strips; strips constructed of metal foil; strips adhesively bonded to the cover; strips embedded in the compressible layer; strips arranged in a grid; printed strips; printed conductive strips; screen printed strips; screen printed conductive ink strips; strips in a side-by-side arrangement; strips in a parallel arrangement; strips in a perpendicular arrangement; strips arranged to define a matrix; overlapping strips arranged to contact the compressible layer; a set of conductive strips bonded to the cover; a set of conductive strips in the base; a matrix of conductive strips between the cover and the base; a matrix of strips embedded in the compressible layer between the cover and the base; a matrix of strips at the compressible layer between the cover and the base.

11. The vehicle interior component of claim 1 wherein the sensor grid comprises at least one of a matrix; a lattice; a grid of flexible strips; a flexible grid; a grid embedded in the compressible layer; a grid embedded in a compressible material; a grid embedded in a foam material; a grid embedded in compressible foam layers; a flexible grid on the deformable material; a grid providing a grid resolution; a grid providing a grid resolution based on an arrangement of strips; a grid configured to be calibrated with the controller; a grid configured to provide a signal based on electrical resistance; a grid providing an electrical response to applied pressure at the contact surface; a grid configured to provide the user interface; a grid configured to provide a signal for control of a vehicle system; a flexible grid responsive to pressure; a grid comprising at least one voltage divider circuit; a grid comprising a current divider; an electromagnetic sensor; a capacitive sensor; a grid providing a pressure sensitive interface at the compressible layer and the deformable material; a flexible grid providing a pressure sensitive interface at the compressible layer wherein the deformable material comprises a deformable foam material and the flexible grid deforms with the deformable foam material.

12. A vehicle interior component providing a user interface comprising:
(a) a base;
(b) a cover configured to cover the base and comprising an exterior surface; and
(c) an intermediate layer between the cover and the base;
(d) a sensor grid at the intermediate layer;
wherein the intermediate layer comprises at least one compressible layer comprising a deformable material;
wherein the interface is provided at the exterior surface of the cover and integrated with the intermediate layer with at least one compressible layer comprising the deformable material and the sensor grid; and
wherein the deformable material of the intermediate layer comprises a polyurethane foam;
wherein the cover comprises a non-translucent flexible material;
wherein the non-translucent flexible material of the cover comprises a cover layer of at least one of (a) leather; (b) vinyl; (c) plastic; (d) wood; (e) textile fabric;
wherein the interface comprises a user interface presented across the polyurethane foam of the intermediate layer and through the non-translucent flexible material of the cover;
wherein the deformable material of the compressible layer is configured to provide electrical properties detectable at the sensor grid and calibrated for operation of the user interface;
wherein the electrical properties of the deformable material of the compressible layer comprise variation of electrical properties detectable at the sensor grid as a detected signal upon interaction at the deformable material of the compressible layer;
wherein the user interface is configured to be operable upon interaction at the deformable material of the compressible layer by detection of variation of electrical properties by the detected signal at the sensor grid;
wherein interaction at the deformable material comprises at least one of surface contact at the deformable material or deformation of the deformable material;
wherein the sensor grid is configured to provide the detectable signal in response to deformation of the deformable material of the intermediate layer integrated with the user interface
so that the user interface is provided at a non-translucent surface comprising the non-translucent material of the cover on a pressure-compressible material comprising the deformable material of the compressible layer.

13. The vehicle interior component of claim 12 wherein the deformable material comprises a polyurethane foam.

14. The vehicle interior component of claim 12 wherein the user interface comprises a pressure sensing interface; wherein the sensor grid comprises a flexible grid configured to deform with the intermediate layer.

15. The vehicle interior component of claim 12 wherein the at least one compressible layer comprises a conductive additive in a compressible material.

16. The vehicle interior component of claim 12 wherein the sensor grid is configured so that input at the user interface comprises at least one of (a) contact at the exterior surface by compressing the at least one compressible layer; (b) contact at the exterior surface by deformation of the deformable material of the at least one compressible layer.

17. A vehicle interior component comprising a user interface at a non-translucent surface on a pressure-deformable material configured for interaction with a vehicle occupant in a vehicle providing at least one vehicle system comprising:
(a) a base;
(b) a cover assembly comprising a cover comprising an exterior surface;
(c) a compressible layer comprising a panel between the cover and the base; and
(d) a sensor grid between the cover and the base;
wherein the panel of the compressible layer comprises a deformable foam material;
wherein the cover comprises a non-translucent flexible material covering the panel of the compressible layer comprising the deformable foam material;
wherein the panel comprising the compressible layer comprises a deformable polyurethane foam panel;
wherein the non-translucent flexible material of the cover comprises a cover layer of at least one of (a) leather; (b) vinyl; (c) plastic; (d) wood; (e) textile fabric;

wherein the sensor grid is configured to provide a signal for at least one vehicle system in response to deformation of the deformable material of the compressible layer;

wherein the user interface configured for interaction with the vehicle occupant is presented at the exterior surface of the cover through the non-translucent flexible material of the cover and across the panel of the compressible layer and integrated with the deformable material of the compressible layer and the sensor grid;

wherein the deformable material of the compressible layer is configured to provide electrical properties detectable at the sensor grid and calibrated for operation of the user interface;

wherein the electrical properties of the deformable material of the compressible layer comprise variation of electrical properties detectable at the sensor grid as a detected signal upon interaction at the deformable material of the compressible layer;

wherein the user interface is configured to be operable upon interaction at the deformable material of the compressible layer by detection of variation of electrical properties by the detected signal at the sensor grid;

wherein interaction at the deformable material comprises at least one of surface contact at the deformable material or compression of the deformable material;

wherein the detected signal comprises the signal in response to deformation of the deformable material of the compressible layer;

wherein the sensor grid for the user interface is configured to be calibrated for control of at least one vehicle system by the signal provided in response to deformation of the deformable material integrated with the user interface;

so that the user interface is configured for control of at least one vehicle system by a vehicle occupant at the exterior surface of the cover through the signal provided at the sensor grid in response to deformation of the deformable material of the compressible layer integrated with the user interface.

18. The vehicle interior component of claim 17 wherein the compressible layer comprises a conductive additive in a compressible material.

19. The vehicle interior component of claim 17 comprising one of a trim panel, an armrest, a headliner, a dashboard, a console, a center console, a door panel, a steering wheel, a seat, an armrest adjacent a seat, a floor, a pillar, a roof pillar, pillar trim.

20. The vehicle interior component of claim 17 wherein the sensor grid is configured provide the signal in response to detection of at least one of (a) depression of the exterior surface; (b) pinching of the exterior surface; (c) twisting of the exterior surface; (d) contact to the sensor grid at the exterior surface; (e) contact to the sensor grid at the exterior surface by compressing the exterior surface; (f) gripping of the exterior surface.

21. The vehicle interior component of claim 17 wherein the sensor grid is configured so that the user interface comprises at least one of (a) contact at the exterior surface by compressing the compressible layer; (b) contact at the exterior surface by deformation of the deformable material of the compressible layer.

* * * * *

UNITED STATES PATENT AND TRADEMARK OFFICE
CERTIFICATE OF CORRECTION

| | |
|---|---|
| PATENT NO. | : 10,705,666 B2 |
| APPLICATION NO. | : 14/852409 |
| DATED | : July 7, 2020 |
| INVENTOR(S) | : C. Kring et al. |

Page 1 of 1

It is certified that error appears in the above-identified patent and that said Letters Patent is hereby corrected as shown below:

On the Title Page

At item (72) Inventors in the left column, replace "Mario J. Enriques Ortiz" with -- Mario J. Enriquez Ortiz --

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*